US010297702B2

(12) United States Patent
Yang et al.

(10) Patent No.: US 10,297,702 B2
(45) Date of Patent: May 21, 2019

(54) POLYCRYSTALLINE SILICON COLUMN AND POLYCRYSTALLINE SILICON WAFER

(71) Applicant: Sino-American Silicon Products Inc., Hsinchu (TW)

(72) Inventors: Cheng-Jui Yang, Hsinchu (TW); Huang Wei Lin, Hsinchu (TW); Yu-Min Yang, Hsinchu (TW); Kuo-Wei Chuang, Hsinchu (TW); Ming-Kung Hsiao, Hsinchu (TW); Yuan Hsiao Chang, Hsinchu (TW); Bo-Kai Wang, Hsinchu (TW); Wen-Huai Yu, Hsinchu (TW); Sung Lin Hsu, Hsinchu (TW); I-Ching Li, Hsinchu (TW); Wen-Ching Hsu, Hsinchu (TW)

(73) Assignee: Sino-American Silicon Products Inc., Hsinchu Science Park (TW)

( * ) Notice: Subject to any disclaimer, the term of this patent is extended or adjusted under 35 U.S.C. 154(b) by 92 days.

(21) Appl. No.: 15/248,867

(22) Filed: Aug. 26, 2016

(65) Prior Publication Data

US 2017/0058428 A1  Mar. 2, 2017

(30) Foreign Application Priority Data

Aug. 26, 2015  (TW) .............................. 104127844 A
Aug. 11, 2016  (TW) .............................. 105125584 A

(51) Int. Cl.
*H01L 31/0368*   (2006.01)
*C01B 33/02*   (2006.01)
(Continued)

(52) U.S. Cl.
CPC ........ *H01L 31/03682* (2013.01); *C01B 33/02* (2013.01); *C30B 11/00* (2013.01);
(Continued)

(58) Field of Classification Search
CPC .. C01B 33/02; C01P 2002/60; C01P 2002/90; C01P 2006/40; C01P 2006/80;
(Continued)

(56) References Cited

U.S. PATENT DOCUMENTS

2015/0082833 A1* 3/2015 Yagi ...................... C30B 11/001
65/32.3

OTHER PUBLICATIONS

Bloem et al. "Carbon in polycrystalline silicon, influence on resistivity and grain size" Appl. Phys. Lett. 40(8) 725-726 (Year: 1982).*
(Continued)

*Primary Examiner* — Amber R Orlando
*Assistant Examiner* — Syed T Iqbal
(74) *Attorney, Agent, or Firm* — Osha Liang LLP

(57) ABSTRACT

A polycrystalline silicon column is provided. The polycrystalline silicon column includes a plurality of silicon grains grown along a crystal-growing direction. In the crystal-growing direction, the average grain size of the silicon grains and the resistivity of the polycrystalline silicon column have opposite variation in their trends, the average grain size of the silicon grains and the oxygen content of the polycrystalline silicon column have opposite variation in their trends, and the average grain size of the silicon grains and the defect area ratio of the polycrystalline silicon column have the same variation in their trends. The overall average defect area ratio of the polycrystalline silicon column is less than or equal to 2.5%.

14 Claims, 16 Drawing Sheets

(51) Int. Cl.
  *H01L 31/18* (2006.01)
  *C30B 28/06* (2006.01)
  *C30B 29/06* (2006.01)
  *C30B 29/60* (2006.01)
  *C30B 11/00* (2006.01)

(52) U.S. Cl.
  CPC ............ *C30B 28/06* (2013.01); *C30B 29/06* (2013.01); *C30B 29/605* (2013.01); *H01L 31/182* (2013.01); *C01P 2002/60* (2013.01); *C01P 2002/90* (2013.01); *C01P 2006/40* (2013.01); *C01P 2006/80* (2013.01); *Y02E 10/546* (2013.01); *Y02P 70/521* (2015.11)

(58) Field of Classification Search
  CPC ......... C30B 11/00; C30B 28/06; C30B 29/06; C30B 29/605; H01L 31/03682; H01L 31/182
  See application file for complete search history.

(56) References Cited

OTHER PUBLICATIONS

Glinchuk et al. "Effect of Carbon on the Minority Carrier Lifetime in Heat-Treated Oxygen-Containing Silicon" phys. stat. sol. (a) 87, K149-K152 (Year: 1985).*
Gao, B. et al. "Crystal growth of high-purity multicrystalline silicon using a unidirectional solidification furnace for solar cells" Journal of Crystal Growth, 2010, p. 1572-1576 (5 pages).

* cited by examiner

POLYCRYSTALLINE SILICON COLUMN AND POLYCRYSTALLINE SILICON WAFER

BACKGROUND

The disclosure relates to a polycrystalline silicon column and a polycrystalline silicon wafer.

A solar cell is a photoelectric device which generates electric energy by absorbing sunlight and performing photovoltaic conversion by means of a photovoltaic effect. Currently, solar cell materials are mainly silicon materials, as silicon is the second most accessible element on earth and has advantages of having low material cost, is nontoxic, has a high stability and the like, and the application of silicon in the semiconductor field has had a profound foundation.

Solar cells mainly made from silicon material are divided into three types, i.e., monocrystalline silicon, polycrystalline silicon and amorphous silicon. Using polycrystalline silicon as the raw material of a solar cell is mainly based on the consideration of cost. As compared with monocrystalline silicon manufactured by the existing Czochralski method (CZ method) and floating zone method (FZ, method), the cost of the polycrystalline silicon is much cheaper relatively.

The polycrystalline silicon used for manufacturing solar cells is conventionally produced by using a general casting process. In brief, the silicon with a high purity is melted in a mold (e.g., a quartz crucible), and then is cooled under controlled solidification to form a polycrystalline silicon ingot. Then, the polycrystalline silicon ingot is generally cut into square wafers, which will be assembled into a cell by a solar cell manufacturer.

The *Journal of Crystal Growth*, 312, 2010, p. 1572-1576 published a method for growing high-purity polycrystalline silicon of solar cell by using a directional solidification crystal-growing furnace. As disclosed in the conventional method as described above, and generally conventionally understood, in the crystal-growing process volatile carbon monoxide gas can be easily generated and, if the content of the carbon monoxide incorporated into a silicon melt is too high, the carbon and oxygen will segregate and separately precipitate or otherwise be incorporated into the solidified crystal formed from the melt. The oxygen-containing sites of a solidified ingot are known to behave as gettering sites for impurities and the influence the mechanical strength of a wafer formed therefrom, which can increase the effect of other crystal defects on degrading the crystal quality. Furthermore, the carbon incorporated in the conventional method as described above can easily generate a silicon carbide precipitate through the reaction between the carbon and silicon in the melt, which may reduce the shunt resistance (R shunt) of a cell, thereby causing more electric leakage phenomenon. Therefore, it is believed by those of ordinary skills in the art that, the too-high carbon and oxygen content causes the aforementioned instance, and thus the photovoltaic conversion efficiency is degraded.

The aforementioned description is only used for providing the background technology, rather than admitting that the aforementioned description discloses the subject matter of the disclosure. The aforementioned description does not constitute the prior art of the disclosure, and any of the aforementioned description should not be considered as any part of the disclosure.

SUMMARY

An embodiment of the disclosure provides a polycrystalline silicon column having a crystal-growing direction. The aforementioned polycrystalline silicon column includes a plurality of silicon grains growing along a crystal-growing direction, wherein in the crystal-growing direction, the average grain size of the silicon grains and the resistivity of the polycrystalline silicon column have opposite variation in their trends.

Another embodiment of the disclosure provides a polycrystalline silicon column having a crystal-growing direction. The aforementioned polycrystalline silicon column includes a plurality of silicon grains growing along a crystal-growing direction, wherein in the crystal-growing direction, the average grain size of the silicon grains and the oxygen content of the polycrystalline silicon column have opposite variation in their trends.

A further embodiment of the disclosure provides a polycrystalline silicon column having a crystal-growing direction. The aforementioned polycrystalline silicon column includes a plurality of silicon grains growing along a crystal-growing direction, wherein in the crystal-growing direction, the average grain size of the silicon grains and the defect area ratio of the polycrystalline silicon column have the same variation in their trends, and the overall average defect area ratio of the polycrystalline silicon column is less than or equal to 2.5%.

Another embodiment of the disclosure provides a polycrystalline silicon wafer including a plurality of silicon grains, wherein the polycrystalline silicon wafer has a carbon content greater than 4 parts per million atoms (ppma), and a resistivity greater than or equal to 1.55 $\Omega$-cm.

A further embodiment of the disclosure provides a polycrystalline silicon wafer including a plurality of silicon grains, wherein the polycrystalline silicon wafer has a carbon content greater than 4 ppma, and an oxygen content greater than or equal to 5.5 ppma.

Yet a further embodiment of the disclosure provides a polycrystalline silicon wafer including a plurality of silicon grains, wherein the polycrystalline silicon wafer has a carbon content greater than 4 ppma, and an average defect area ratio less than or equal to 1.5%.

The polycrystalline silicon column of the disclosure has a higher carbon content, and especially the bottom section thereof has a higher carbon content and a lower defect area ratio, such that the polycrystalline silicon wafer manufactured by cutting the polycrystalline silicon column also has a higher carbon content and a lower defect area ratio, and therefore a higher photovoltaic conversion efficiency.

The technical features and advantages of the disclosure summarized relatively widely above make the detailed description of the disclosure hereafter better understood. Other technical features and advantages constituting the subject matter of the claims of the disclosure will be described hereafter. It should be understood by those of ordinary skills in the art of the disclosure that, the object of the disclosure can be achieved by modifying or designing other structures or processes. It should also be understood by those of ordinary skills in the art of the disclosure that, such an equivalent construction cannot depart from the spirit and scope of the disclosure as defined by the accompanying claims.

BRIEF DESCRIPTION OF DRAWINGS

Aspects of the disclosure will be understood best by reading the following detailed description in connection with the drawings. It should be noted that, according to the standard implementation of the industry, various features are not drawn to scale. In practical, for clarity of discussion, dimensions of various features may be arbitrarily increased or decreased.

DETAILED DESCRIPTION

Figure 1:
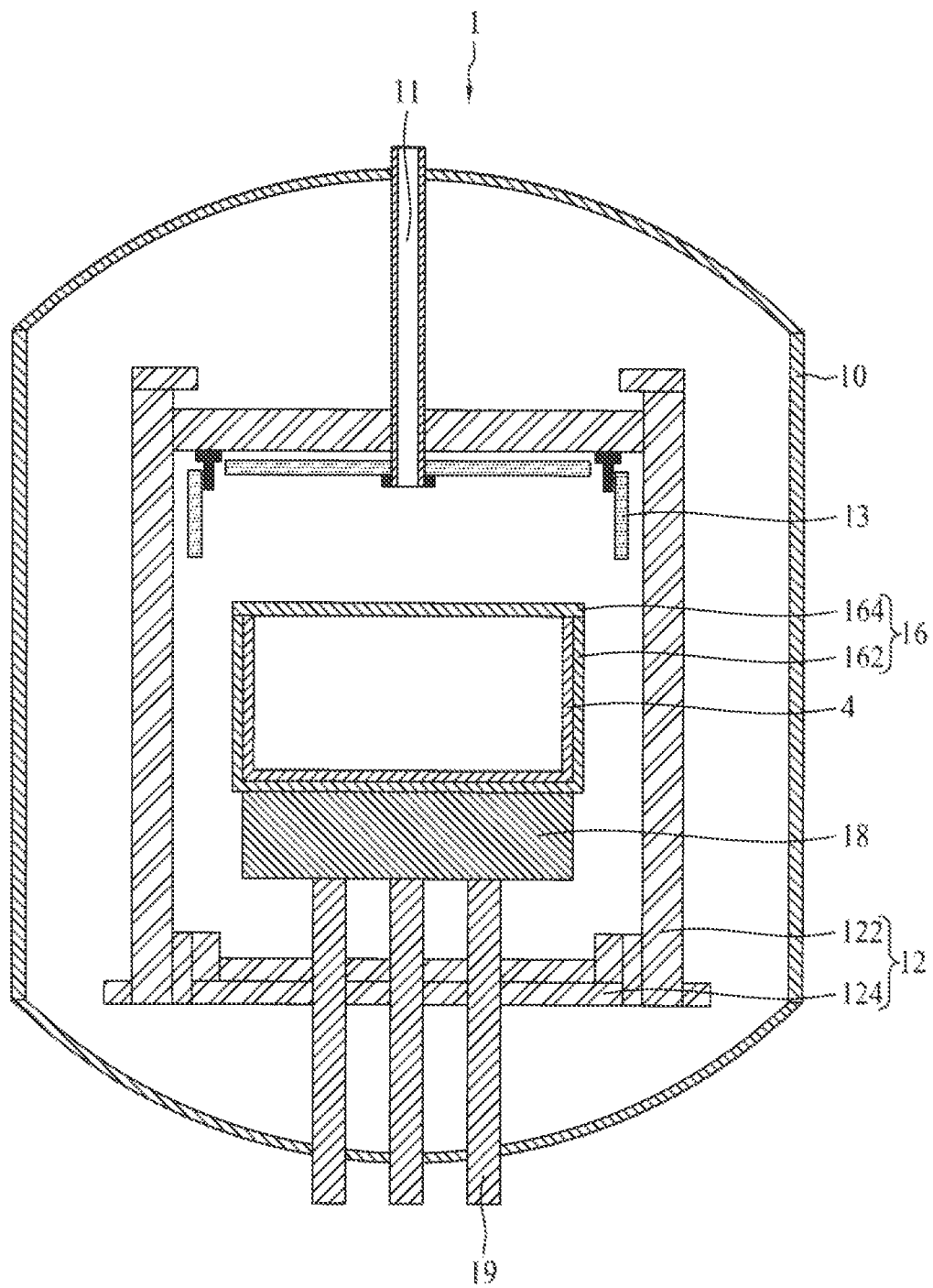
FIG. 1 illustrates a DSS (directional solidification system) crystal-growing furnace used by an embodiment of the disclosure.

The following disclosure provides many different embodiments and examples to implement different features of the application. The particular examples of elements and configurations are described hereafter so as to simplify the disclosure of the application. Of course, these are only used as examples, rather than limiting the application. For example, in the following description, forming a first feature on or above a second feature includes forming the first feature as being directly in contact with the second feature, and also includes the embodiment of forming other features between the first feature and the second feature, such that the first feature and the second feature are not directly in contact with each other. Furthermore, the numerical symbols and/or characters are repeatedly used in different examples of the application. Such a repeat is used for the purpose of simplifying and clarifying, rather than controlling the relationship between different embodiments and/or the discussed architecture.

Moreover, the application can use simplified illustration of spatial corresponding phrases, such as "under", "below", "higher than", "relatively higher" and the like to describe the relationship between an element or feature and another element or feature in the drawings. The spatial corresponding phrases are used as including different orientations of a device during the use or operation, in addition to including the orientations described in the drawings. The device may be located (rotated by 90 degrees or in other orientations), and the spatial corresponding descriptions used in the application can be explained accordingly.

The embodiments of the disclosure disclose several techniques for improving a carbon content of a polycrystalline silicon column or a polycrystalline silicon wafer. The following illustrates a method for improving the carbon content of a polycrystalline silicon column during the growing process of the polycrystalline silicon column, which can effectively improve the photoelectric conversion efficiency of a solar silicon wafer. Furthermore, in addition to having a higher carbon content, the polycrystalline silicon column or polycrystalline silicon wafer manufactured by the embodiments of the disclosure also has the characteristics of an average grain size of the silicon grains increased progressively along the crystal-growing direction, a smaller average defect area ratio, and the like.

Herein, the term "polycrystalline silicon column" may be a polycrystalline silicon ingot, a polycrystalline silicon brick, or any other polycrystalline silicon column having any cross-section shape or size. For example, the cross-section shape of the polycrystalline silicon column may be a polygon, such as a square, circular, or other geometrical shapes. Herein, the term "polycrystalline silicon ingot" refers to a polycrystalline silicon column formed by cooling along a crystal-growing direction after the silicon is melted in a mold, in some embodiments, the cross-section shape of the polycrystalline silicon ingot in a direction perpendicular to the crystal-growing direction is a square, wherein the cross-section size may be for example 690 mm*690 mm, 840 mm*840 mm, 1000 mm*1000 mm, or other suitable sizes, and the height of the cross section may be for example but not limited to 300 mm. The term "polycrystalline silicon brick" refers to a polycrystalline silicon column formed by cutting a polycrystalline silicon ingot along a crystal-growing direction. In some embodiments, the cross-section shape of the polycrystalline silicon brick in a direction perpendicular to the crystal-growing direction is a square, wherein the cross-section size may be for example 156 mm*156 mm or other suitable sizes, and the height of the cross section may be for example but not limited to 300 mm. Herein, the term "polycrystalline silicon wafer" refers to a polycrystalline silicon wafer formed by cutting a polycrystalline silicon ingot or polycrystalline silicon brick along a direction perpendicular to the crystal-growing direction. In some embodiments, the shape and size of the polycrystalline silicon wafer is the same as the cross-section shape and size of the polycrystalline silicon brick in a direction perpendicular to the crystal-growing direction, and the width of the polycrystalline silicon wafer is fir example but not limited to between 0.1 mm and 3.0 mm.

A reference is made to FIG. 1. FIG. 1 illustrates a DSS (directional solidification system) crystal-growing furnace used by a manufacturing method according to an embodiment of the disclosure. A DSS crystal-growing furnace 1 includes a furnace body 10, a heat insulation cage 12 consisting of an upper heat-insulation cover 122 and a lower heat-insulation plate 124, a directional solidification block 18 disposed in the heat insulation cage 12, at least one supporting column 19 used for supporting the directional solidification block 18, a box body 16 disposed on the directional solidification block 18, a mold 4 disposed in the box body 16, a heater 13 disposed above the mold 4, and a inert-gas tube 11 passing through the furnace body 10 and the heat insulation cage 12. In this embodiment, the mold 4 may be a quartz crucible or a mold made of other heat-resistant materials; the directional solidification block 18 may be made of graphite or other heat-resistant materials; the box body 16 includes a base 162 and an upper cover plate 164, and may be made of graphite or other heat-resistant materials; and the inert-gas tube 11 is used for introducing inert gases such as argon into the heat insulation cage 12. In this embodiment, the melting point of the box body 16 is higher than that of the mold 4, such that the deformation of itself can be avoided and thus the deformation of the mold 4 under heat can be prevented, and meanwhile the contaminants in the DSS crystal-growing furnace 1 can be isolated, such as the dust of oxide, carbide and carbon element generated under a high temperature.

Figure 2:
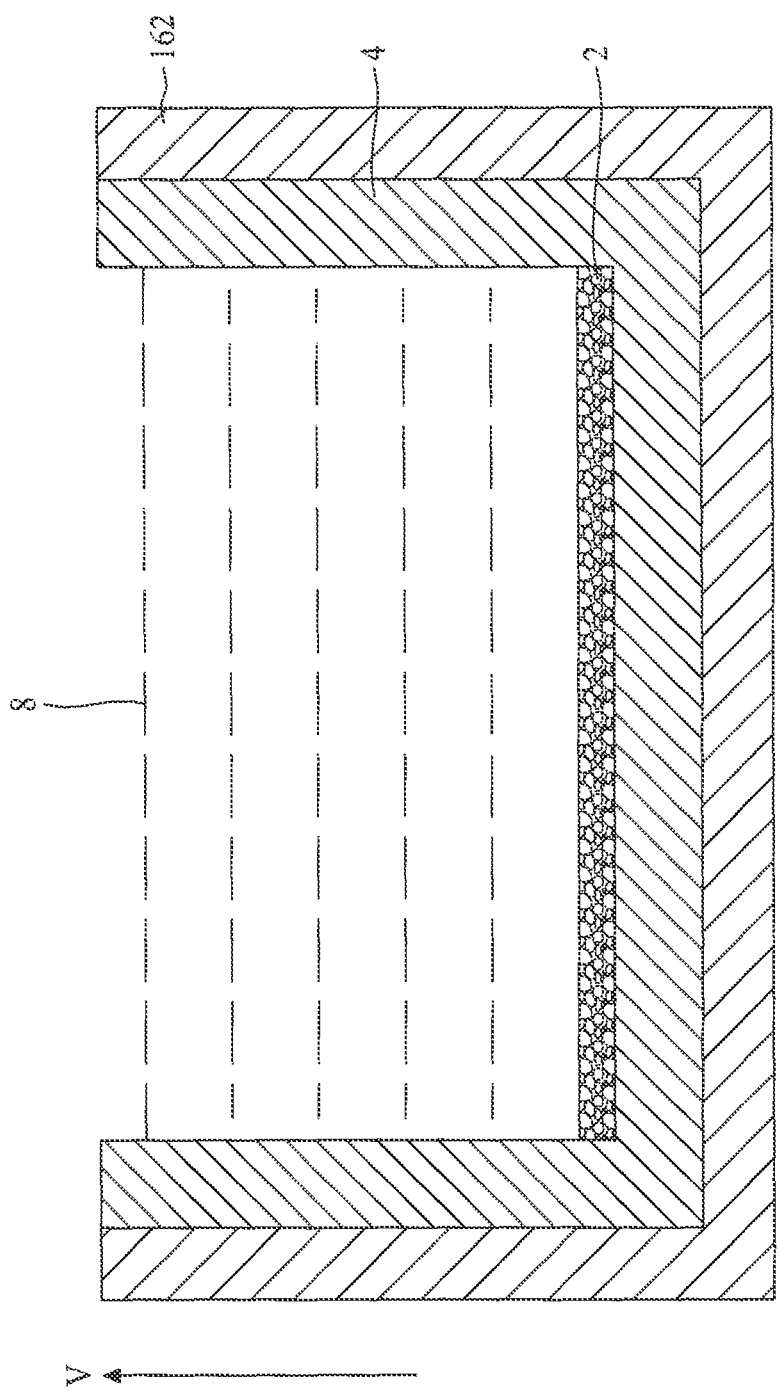
FIG. 2 illustrates a method for manufacturing a polycrystalline silicon ingot according to an embodiment of the disclosure.

A reference is made to FIG. 2 as well as FIG. 1. FIG. 2 illustrates a method for manufacturing a polycrystalline silicon ingot according to an embodiment of the disclosure. The method for manufacturing a polycrystalline silicon ingot according to the embodiment includes the following steps. First, a nucleation promotion layer 2 is placed onto the bottom portion of the mold 4, and then the silicon raw material is placed into the mold 4. Then, the mold 4 filled with the silicon raw material is placed into the DSS crystal-growing furnace 1 as shown in FIG. 1, wherein the mold 4 is placed in the base 162 of the box body 16, but the upper cover plate 164 of the box body 16 is removed deliberately to expose the mold 4 in the DSS crystal-growing furnace 1. Under heating by the DSS crystal-growing furnace 1, the silicon raw material is completely melted into a silicon melt 8, and the nucleation promotion layer 2 is partially melted, while other parts of the nucleation promotion layer 2 are not melted. Thereafter, the mold 4 is cooled through a directional solidification process, such that a plurality of polycrystalline silicon grains gradually grow along a crystal-growing direction (V) to form a polycrystalline silicon ingot with a higher carbon content. In this embodiment, the silicon raw material is melted into a silicon melt 8 under the situation that the upper cover plate 164 of the box body 16 is removed. That is, the polycrystalline silicon grains grow from the silicon raw material under the environment that the silicon raw material is exposed in the DSS crystal-growing furnace 1, and since the elemental materials, such as the carbon fiber insulation material and the heat conduction material made from a graphite plate, of the DSS crystal-growing furnace 1 all includes carbon, the carbide and carbon elements generated under the high temperature conditions used readily enter into the silicon melt 8, such that the manufactured polycrystalline silicon ingot has a higher carbon content.

In an embodiment of the disclosure, the operation of the DSS crystal-growing furnace 1 is as follows, but not limited to this. (1) The temperature rise from a heating portion to a melting portion is greater than 1414° C., such that the melting of the silicon raw material is started. (2) When the temperature of the silicon melt is increased to 1500-1570° C., the heat insulation cage 12 is opened to 11 cm, such that the temperature of the directional solidification block 18 is about 1350-1400° C., and the remaining height of the crushed bottom material (nucleation promotion layer 2) is controlled to be 50-70 mm; when the temperature of the silicon melt is decreased to 1450-1500° C., the heat insulation cage 12 is opened to 1-8 cm, such that the temperature of the directional solidification block 18 is not greater than 1330-1350° C., and the remaining height of the crushed bottom material (nucleation promotion layer 2) is controlled to be 30-50 mm; and when the temperature of the silicon melt is decreased to 1390-1450° C., the heat insulation cage 12 is opened to 1-8 cm, such that the temperature of the directional solidification block 18 is not greater than 1320-1340° C., and the remaining height of the crushed bottom material (nucleation promotion layer 2) is controlled to be 15-30 mm, and then the process enters the crystal-growing portion again. (3) The initial temperature of the crystal-growing portion is set as 1385-1430° C., the final temperature is set as 1385-1400° C., and the heat insulation cage 12 is opened from the initial 1-6 cm to the final 15-30 cm, so as to complete the crystal growing. (4) After the crystal growing is completed, the annealing and cooling processes are completed sequentially.

In one or more embodiments, the nucleation promotion layer 2 consists of multiple crystalline particles with irregular and non-uniform shapes, and the grain size of each crystalline particle is less than about 50 mm, and preferably less than about 10 mm. For example, the crystalline particles may be crushed pieces of polycrystalline or monocrystalline materials. In one or more embodiments, the crystalline particles may be polycrystalline silicon particles, monocrystalline silicon particles, monocrystalline silicon carbide particles, or other crystalline particles which are formed by a material with a melting point greater than about 1400° C. and promote nucleation. In another embodiment of the disclosure, the nucleation promotion layer is a plate body formed by a material with a melting point greater than about 1400° C., and the surface of the plate body in contact with the melted silicon soup has a roughness in a range from 300 mm to 1000 μm, so as to provide multiple nucleation points.

Figure 3:
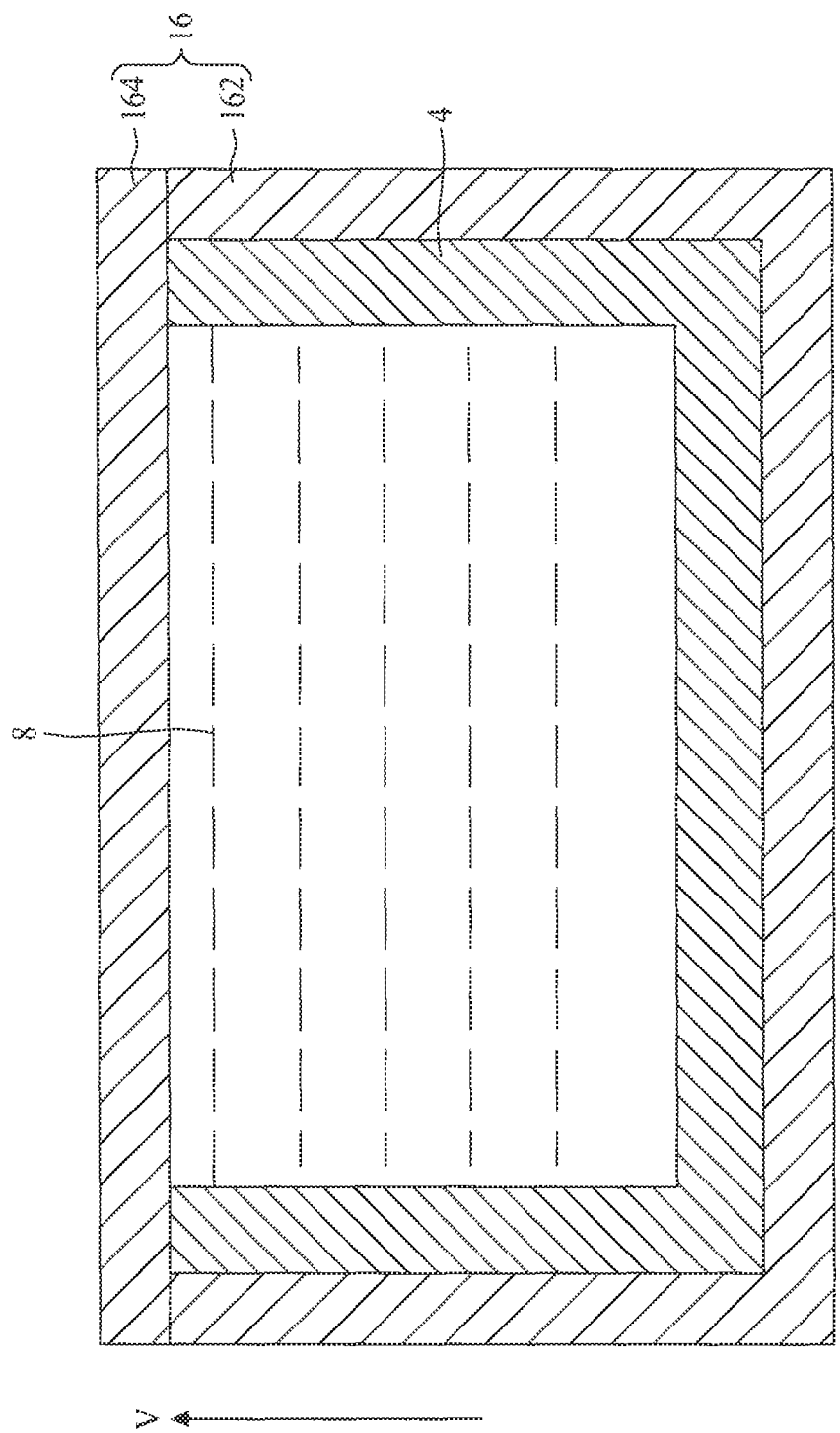
FIG. 3 illustrates a method for manufacturing a polycrystalline silicon ingot according to a control group of the disclosure.

A reference is made to FIG. 3. FIG. 3 illustrates a method for manufacturing a polycrystalline silicon ingot according to a control example of the disclosure. The method for manufacturing the polycrystalline silicon ingot of the control example uses a whole melting process, which doesn't use the nucleation promotion layer, and the crystal grows after the silicon raw materials are completely melted. The manufacturing method of the control example includes the following steps. The silicon raw material is put into the mold 4; then the mold 4 filled with the silicon raw material is put into the DSS crystal-growing furnace 1 as shown in FIG. 1, wherein the mold 4 is placed in the box body 16, and the box body 16 is covered by the upper cover plate 164. First, the silicon raw material is completely melted into the silicon melt 8 in the DSS crystal-growing furnace 1. Thereafter, the mold 4 is cooled through a directional solidification process, such that a plurality of polycrystalline silicon grains gradually grow along a crystal-growing direction (V) to form a polycrystalline silicon ingot. As compared with the embodiments of the disclosure in which during the crystal-growing process, the upper cover plate 164 of the box body 16 is removed deliberately such that parts of the carbide and carbon elements generated under the high temperature are added into the silicon melt 8; in the control example of the disclosure, during the crystal-growing process, the upper cover plate 164 of the box body 16 is not removed, such that no carbon element is added into the silicon melt 8. It can be seen from the above that the polycrystalline silicon column formed by using the manufacturing method of the present disclosure has a higher carbon content.

In an embodiment of the disclosure, a carrier lifetime tester (u-PCD; Microwave Lifetime Tester) may be used to measure a relationship curve of the minority carrier lifetime of the polycrystalline silicon column versus the crystal-growing direction (V). The carrier lifetime tester uses a measuring head to irradiate a laser pulse onto a region of the polycrystalline silicon column with a higher carbon content, such that electrons and electron holes are excited, then a microwave is used to irradiate the region already excited by the laser pulse, and then the time of the carrier separating from and combining with the silicon crystal is measured; and thereafter, the measuring head is moved along the crystal-growing direction (V) to perform the measurement, such that a relationship curve of the minority carrier lifetime versus the crystal-growing direction (V) is formed. After the relationship curve of the minority carrier lifetime (life time) of various portions of the polycrystalline silicon column versus the crystal-growing direction (V) is obtained, the minority carrier lifetime can be used as a standard for defining an available section and an unavailable section of the polycrystalline silicon column. In the disclosure, the carrier lifetime tester can be used for measuring the minority carrier lifetime of the polycrystalline silicon ingot or the polycrystalline silicon brick.

Figure 4:
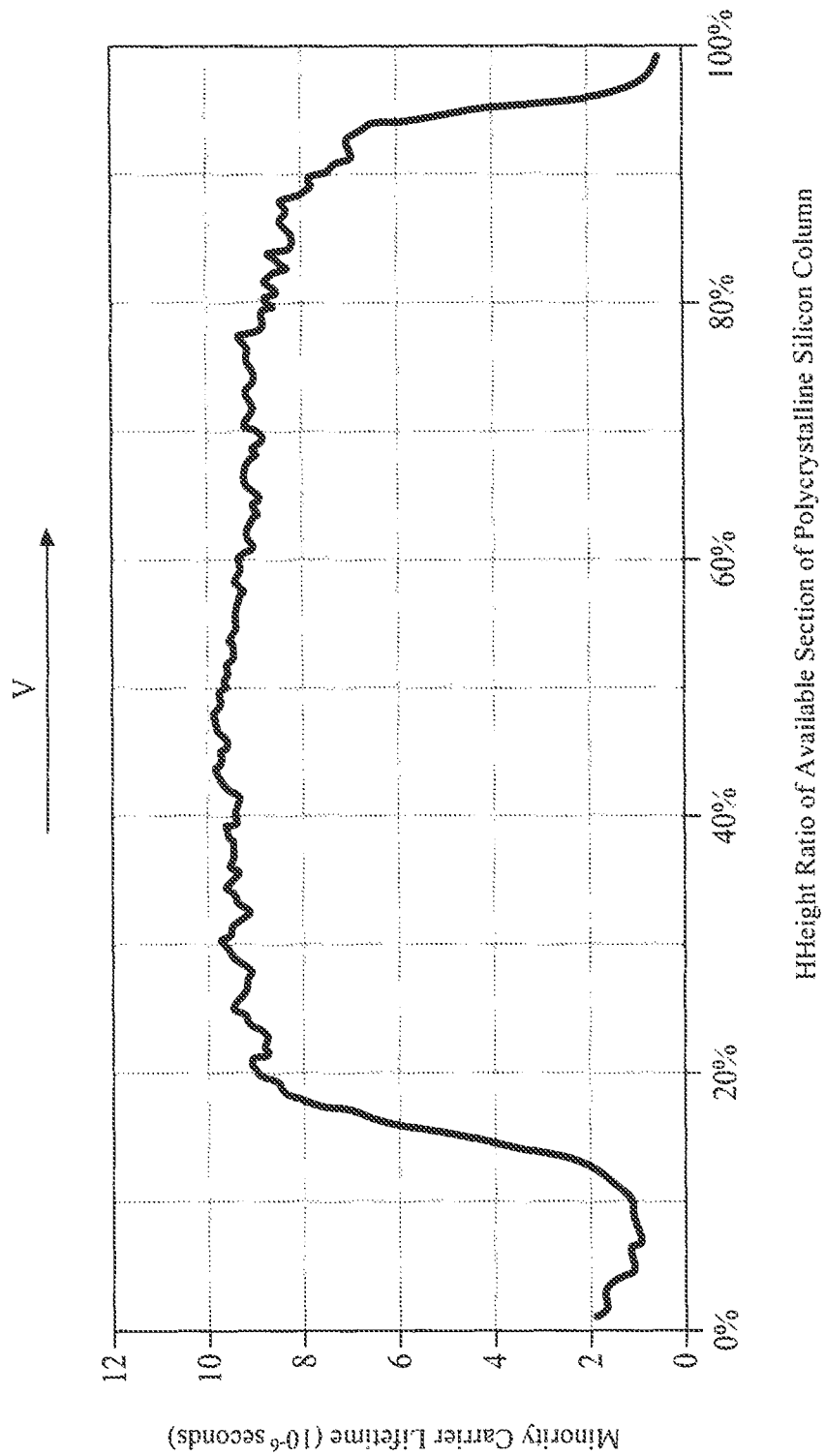
FIG. 4 illustrates a relationship curve of the minority carrier lifetime of the polycrystalline silicon column according to an embodiment of the disclosure versus the crystal-growing direction.

A reference is made to FIG. 4. FIG. 4 illustrates a relationship curve of the minority carrier lifetime of the polycrystalline silicon column according to an embodiment of the disclosure versus the crystal-growing direction, wherein the longitudinal axis is the minority carrier lifetime, and the horizontal axis is the height ratio of the available section of the polycrystalline silicon column. In one or more embodiments, a section with a minority carrier lifetime greater than or equal to a specific value is defined as an available section, while a section with a minority carrier lifetime less than the specific value is defined as an unavailable section which can be cut and removed. For example, in one or more embodiments, a section of the polycrystalline silicon column with a minority carrier lifetime greater than or equal to $2.0 \times 10^{-6}$ seconds is defined as an available section, and a section with a minority carrier lifetime less than $2.0 \times 10^{-6}$ seconds is defined as an unavailable section which can be cut of and removed. As shown in FIG. 4, in general, the sections located at the bottom end and the top end of the polycrystalline silicon column are sections with low carrier lifetimes, i.e., unavailable sections to be cut off and removed, and the sections remaining after the unavailable sections are cut off and removed are available sections. In an embodiment, along the crystal-growing direction (V) the available section may further include a bottom section, a middle section and a top section, wherein the ratio of the bottom section, the middle section and the top section is defined according to the resistivity, the average defect area ratio, the oxygen content, the average grain size and other characteristics. For example, in one or more embodiments, an available section of the polycrystalline silicon column in which the average grain size of the polycrystalline silicon column in the crystal-growing direction and the resistivity of the polycrystalline silicon column have the opposite variation in their trends, the resistivity is greater than or equal to 1.55 Ω-cm, or the average grain size is less than or equal to 1.0 cm, or the oxygen content is greater than or equal to 5.5 ppma is considered as the bottom section. In one or more embodiments, an available section of the polycrystalline silicon column in which the average grain size of the polycrystalline silicon column in the crystal-growing direction and the oxygen content have the opposite variation in their trends, the resistivity is greater than or equal to 1.55 Ω-cm, or the average grain size less than or equal to 1.0 cm, or the oxygen content is greater than or equal to 5.5 ppma is considered as the bottom section. In one or more embodiments, an available section of the polycrystalline silicon column in which the average grain size of the polycrystalline silicon column in the crystal-growing direction and the defect area ratio have the same variation in their trend, the resistivity is greater than or equal to 1.55 Ω-cm or the average grain size less than or equal to 1.0 cm, or the oxygen content is greater than or equal to 5.5 ppma is considered as the bottom section.

In an embodiment, the crystal orientation distribution of the silicon grains in the polycrystalline silicon column may be analyzed through electron backscattered diffraction (EBSD). A reference is made to Table 1. Table 1 illustrates an analysis result of the crystal orientation distribution of the silicon grains in the polycrystalline silicon column according to an embodiment of the disclosure and according to a control example. It can be seen from the upper half portion of table 1 that, in addition to the crystal orientations {111}, {112}, {113}, {315} and {115}, the polycrystalline silicon column of the embodiment also include crystal orientations {100}, {313} and {101}. In an embodiment, using the bottom end of the available section of the polycrystalline silicon column as a baseline, the crystal orientation distribution measured at the position with a height ratio of about 1% is considered as the crystal orientation distribution of the bottom section; the crystal orientation distribution measured at the position with a height ratio of about 50% is considered as the crystal orientation distribution of the middle section; and the crystal orientation distribution measured at the position with a height ratio of about 100% is considered as the crystal orientation distribution of the top section.

The volume percent sum of the silicon grains having the crystal orientations {112}, {113} and {115} in the bottom section of the polycrystalline silicon column according to one or more embodiments accounts for greater than 45% of the overall silicon grains with different crystal orientations in the polycrystalline silicon column; the volume percent sum of the silicon grains having the crystal orientation {112} in the bottom section accounts for between 25% and 30% of the overall silicon grains with different crystal orientations in the polycrystalline silicon column; and the volume percent of the silicon grains having the crystal orientation {112} in the bottom section is greater than the volume percent of the silicon grains having the crystal orientation {113} or {115} in the bottom section. For example, it can be seen from Table 1 that the volume percent sum of the silicon grains having the crystal orientations {112}, {113} and {115} in the bottom section of the polycrystalline silicon column according to one or more embodiments accounts for about 50.7% of the overall silicon grains with different crystal orientations in the polycrystalline silicon column; the volume percent sum of the silicon grains having the crystal orientation {112} in the bottom section accounts for about 26.2% of the overall silicon grains with different crystal orientations in the polycrystalline silicon column; and the volume percent of the silicon grains having the crystal orientation {112} in the bottom section is greater than the volume percent of the silicon grains having the crystal orientation {113} or {115} in the bottom section. On the other hand, the volume percent sum of the silicon grains having the crystal orientations {112}, {113} and {115} in the bottom section of the polycrystalline silicon column according to the control example only accounts for 44.8% of the overall silicon grains with different crystal orientations in the polycrystalline silicon column. That is, the volume percent of the three crystal orientations {112}, {113} and {115} is less than 45%, wherein the volume percent of the silicon grains having the crystal orientation {112} in the bottom section is less than the volume percent of the silicon grains having the crystal orientation {113} or {115} in the bottom section, and the volume percent of the silicon grains having the crystal orientation {112} in the bottom section only 5.8%. That is, the volume percent of the crystal orientation {112} is less than the range of 25%-30%.

uneven and are obviously presented as being increased progressively. Furthermore, as compared with the control example, the overall carbon content of the polycrystalline silicon column of the embodiments according to the present disclosure is obviously higher, especially for the carbon content in the bottom section.

Figure 7:
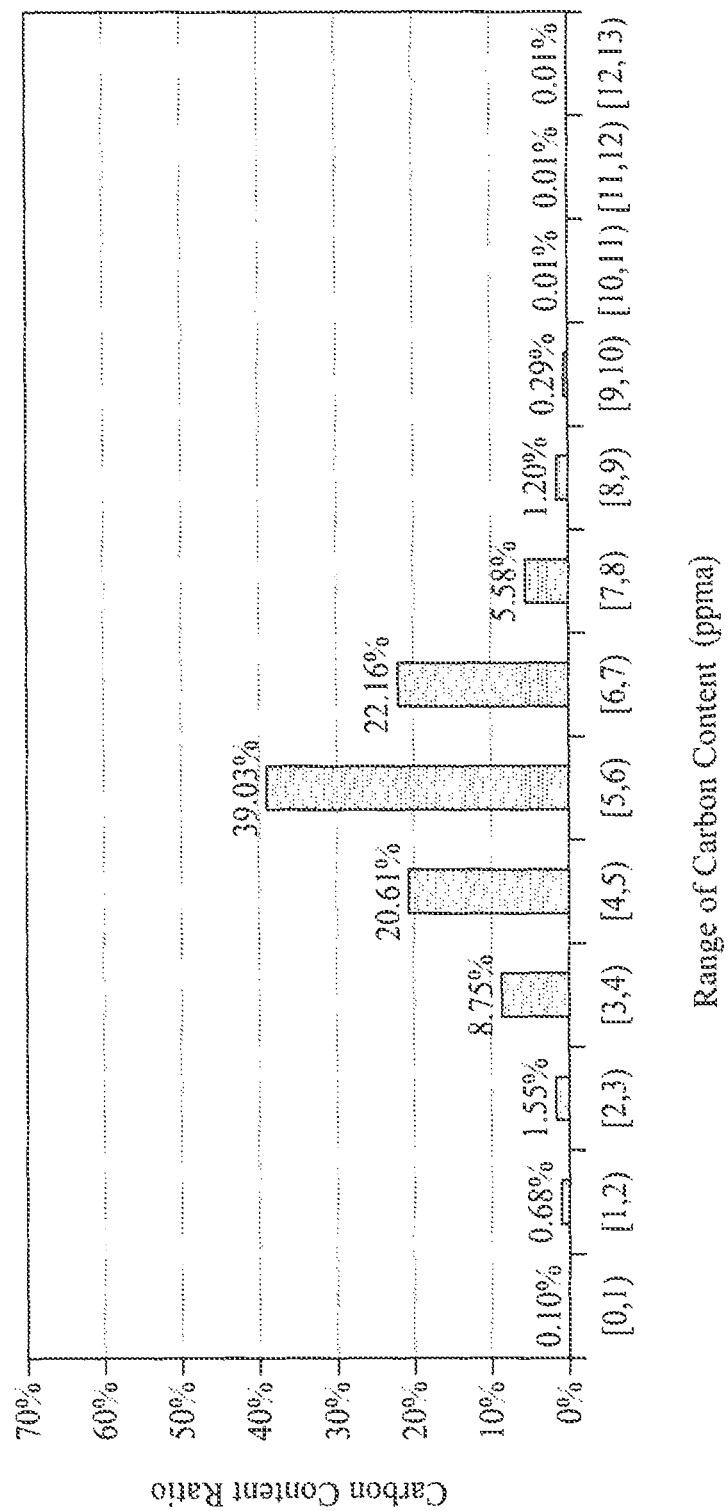
FIG. 7 is a distribution diagram of the carbon content in the bottom section of the polycrystalline silicon column according to an embodiment of the disclosure.

A reference is made to FIG. 7. FIG. 7 is a distribution diagram of the carbon content in the bottom section of the polycrystalline silicon column according to an embodiment of the disclosure. As shown in FIG. 7, in this embodiment, more than 80% of the polycrystalline silicon column in the bottom section has a carbon content greater than or equal to 4 ppma, and for example, about 88% of the polycrystalline silicon column in the bottom section has a carbon content greater than or equal to 4 ppma; more than 60% of the polycrystalline silicon column in the bottom section has a carbon content greater than or equal to 5 ppma, and for example, about 68% of the polycrystalline silicon column in the bottom section has a carbon content greater than or equal to 5 ppma; and more than 25% of the polycrystalline silicon column in the bottom section has a carbon content greater than or equal to 6 ppma, and for example, about 29% of the polycrystalline silicon column in the bottom section has a

TABLE 1

|  | {100} | {101} | {111} | {112} | {113} | {115} | {313} | {315} |
|---|---|---|---|---|---|---|---|---|
| Embodiment of The Application | | | | | | | | |
| The bottom position | 2.1 | 2.6 | 16.1 | 26.2 | 11.0 | 13.5 | 3.8 | 25.1 |
| The middle position | 1.8 | 2.6 | 21.1 | 28.3 | 8.3 | 18.7 | 4.4 | 15.8 |
| The top position | 0.4 | 0.4 | 17.5 | 19.7 | 11.5 | 29.6 | 3.7 | 17.5 |
| Control Example | | | | | | | | |
| The bottom position | 0.3 | 8.3 | 11.3 | 5.8 | 30.2 | 8.8 | 7.9 | 23.3 |
| The middle position | 0.8 | 9.9 | 20.3 | 16.3 | 16.8 | 8.6 | 13.7 | 16.1 |
| The top position | 1.1 | 8.3 | 17.7 | 25.3 | 16.6 | 9.7 | 7.6 | 13.7 |

Figure 5:
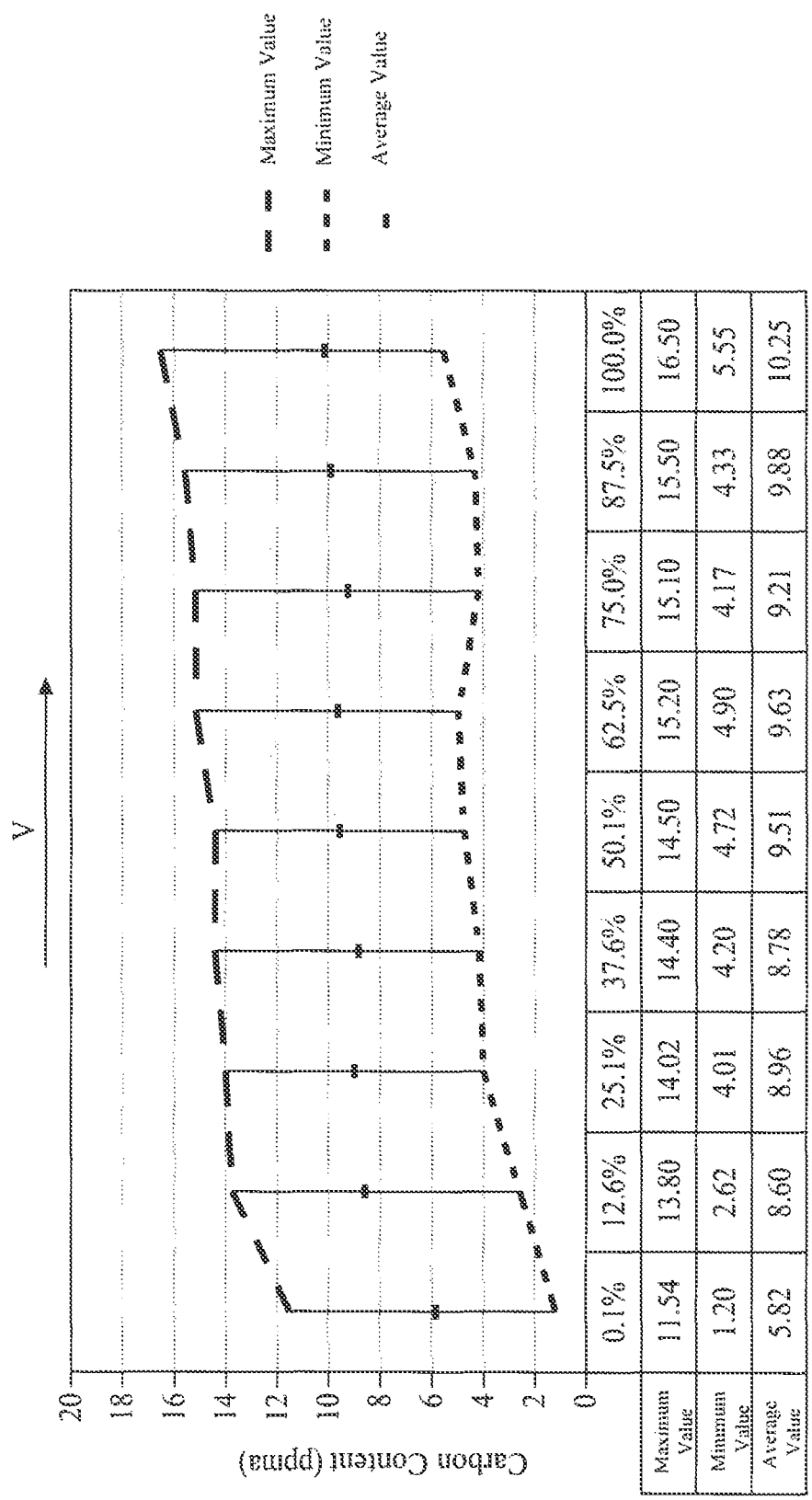
FIG. 5 is a relationship graph of the polycrystalline silicon column according to an embodiment of the disclosure, between the carbon content in the crystal-growing direction and the height ratio of the available section of the polycrystalline silicon column.
Figure 6:
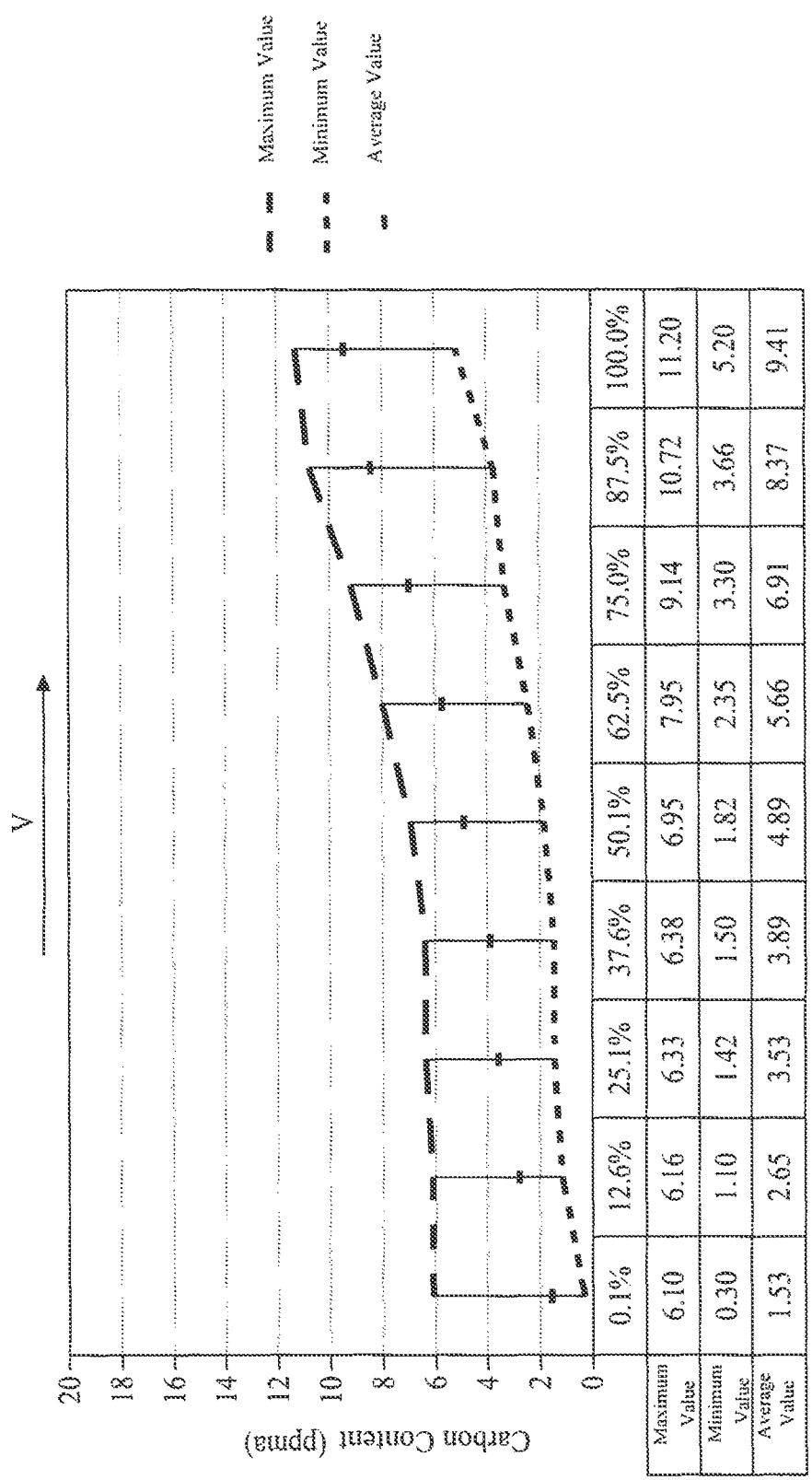
FIG. 6 is a relationship graph of the polycrystalline silicon column according to a control example, between the carbon content in the crystal-growing direction and the height ratio of the available section of the polycrystalline silicon column.

A reference is made to FIGS. 5 and 6. FIG. 5 is a relationship graph of polycrystalline silicon columns according to an embodiment of the disclosure, between the carbon content in the crystal-growing direction and the height ratio of the available section of the polycrystalline silicon columns; and FIG. 6 is a relationship graph of polycrystalline silicon columns according to a control example, between the carbon content in the crystal-growing direction and the height ratio of the available section of the polycrystalline silicon columns, wherein the longitudinal axis is the carbon content, and the horizontal axis is the height ratio of the available section of the polycrystalline silicon columns in the crystal-growing direction. As shown in FIGS. 5 and 6, according to the measuring results of multiple groups of polycrystalline silicon column samples, the carbon content distribution at different positions of the polycrystalline silicon column according to the embodiment in the crystal-growing direction (V) is relatively even, while the carbon content distribution at different positions of the polycrystalline silicon column according to the control example in the crystal-growing direction (V) is relatively carbon content greater than or equal to 6 ppma. Accordingly, more than 80% of the polycrystalline silicon wafer manufactured by cutting the bottom section of the polycrystalline silicon column according to this embodiment has a carbon content greater than 4 ppma; more than 60% of the polycrystalline silicon wafer has a carbon content greater than 5 ppma; and more than 25% of the polycrystalline silicon wafer has a carbon content greater than 6 ppma.

Figure 8:
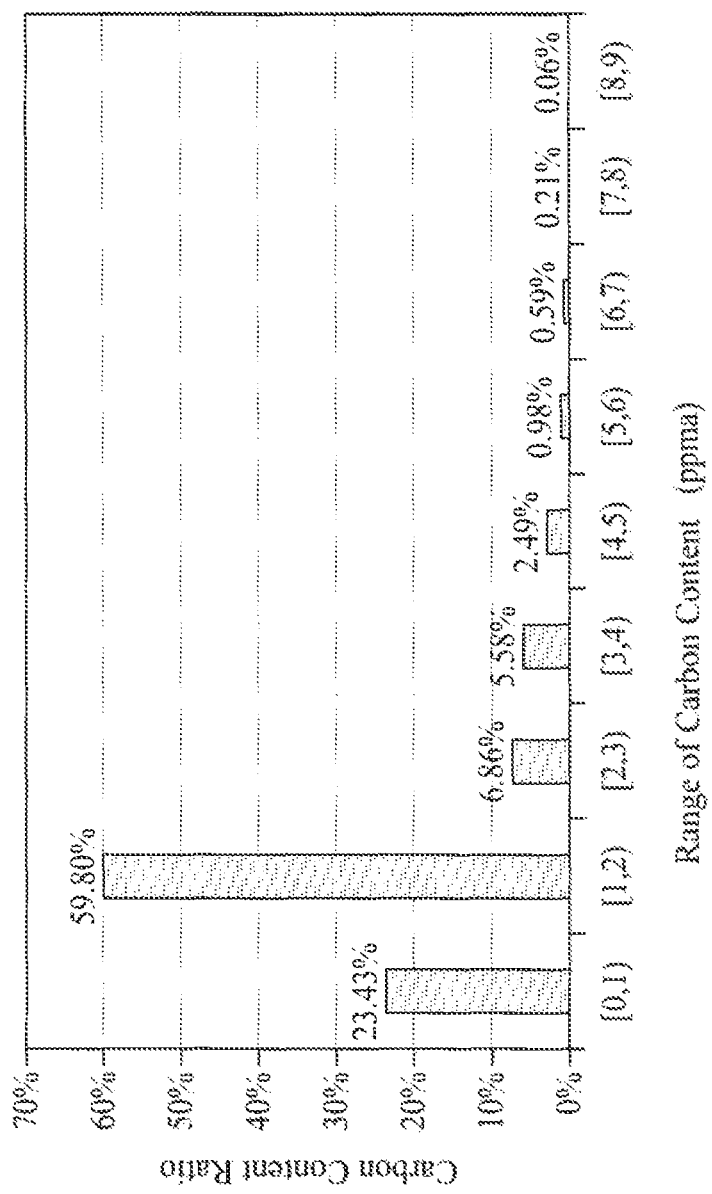
FIG. 8 is a distribution diagram of the carbon content in the bottom section of the polycrystalline silicon column according to a control example.

A reference is made to FIG. 8. FIG. 8 is a distribution diagram of the carbon content of the bottom section of the polycrystalline silicon column according to a control example. As shown in FIG. 8, in the control example, only more than 4% of the polycrystalline silicon column in the bottom section has a carbon content greater than or equal to 4 ppma. That is, most of the polycrystalline silicon column according to the control example in the bottom section has a carbon content less than 4 ppma, which is obviously different from the carbon content distribution in the bottom section of the polycrystalline silicon column of this embodiment.

Figure 9:
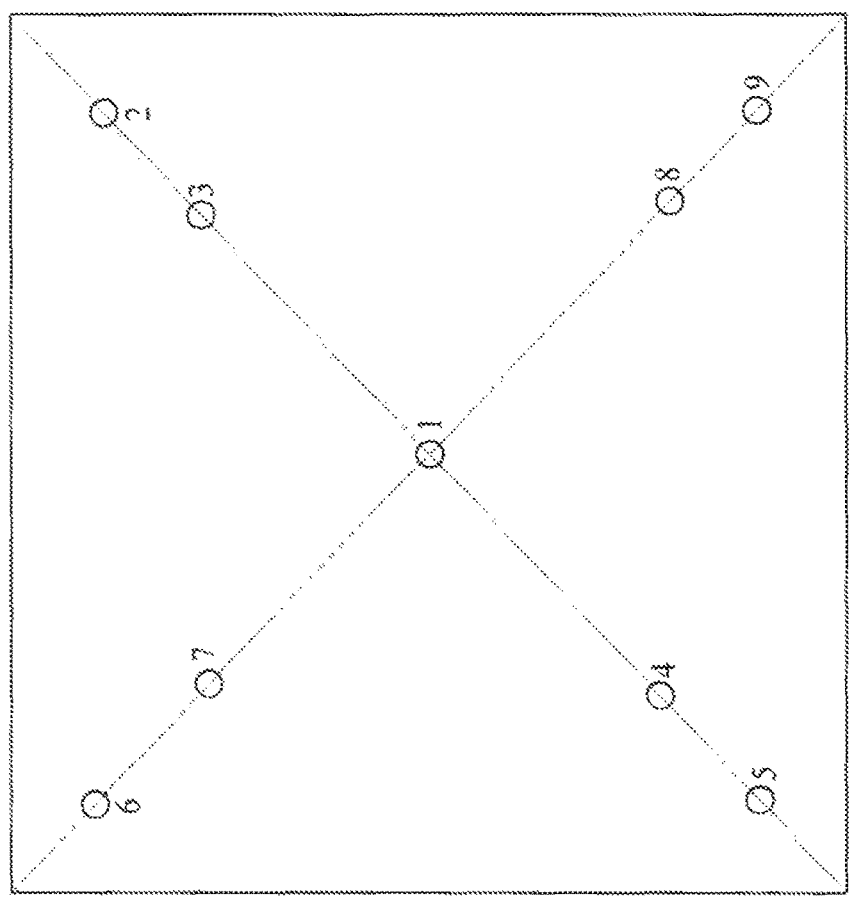
FIG. 9 illustrates a schematic diagram of locations for measuring the carbon content of the polycrystalline silicon column of the embodiment.

The aforementioned carbon contents of the polycrystalline silicon columns according to the embodiments of the disclosure and according to the control example are measured by using a Fourier transform infrared spectroscopy (FTIR) measuring instrument, with reference to the SEMI MF 1391-0704 standard measurement specification. A reference is made to FIG. 9. FIG. 9 illustrates a schematic diagram of a location for measuring the carbon content of the polycrystalline silicon column of the embodiment. The particular measuring method of the carbon content of the polycrystalline silicon column of this embodiment is as follows. First, the polycrystalline silicon column is cut into a plurality of test specimens. Then, the carbon contents at nine different positions of a test specimen is measured using the FTIR measuring instrument. Finally, an average value of the respective carbon contents of the nine positions on the test specimen as measured in a single test is calculated, and an overall average value obtained after the test is repeated for five times is regarded as the carbon content of this test specimen. As shown in FIG. 9, the test specimen of the embodiment is a square test specimen with a size of 156 mm*156 mm and a width between 0.1 mm and 3 mm, such as 0.2 mm or 2 mm. The position 1 on the test specimen is the cross-point position of two diagonal lines. The positions 2, 5, 6 and 9 are symmetric about the symmetric center, position 1, and are respectively located on the diagonal lines, being away from the respective adjacent corners with a distance of about 10 mm. The positions 3, 4, 7 and 8 are symmetric about the symmetric center, position 1, and are respectively located on the diagonal lines, being away from the position 1 with a distance of about 50.8 mm. Additionally, the relationship of the carbon content of the polycrystalline silicon column in the bottom section as mentioned in FIGS. 7 and 8 refers to a relationship which is obtained by cutting the bottom section into multiple pieces of test specimens, measuring the carbon contents of respective test specimens in the aforementioned way, and then carrying out a statistics of the ratio of the number of test specimens with different carbon contents to the number of overall test specimens. For example, if the bottom section of the polycrystalline silicon column is cut into 100 pieces of test specimens, then after the carbon content of each of the 100 pieces of test specimens is measured in the aforementioned way, the test specimens are divided into several, groups based on the carbon contents (for example, the carbon content of the first group is greater than or equal to 0 ppma and is less than 1 ppma; the carbon content of the second group is greater than or equal to 1 ppma and is less than 2 ppma, and so on), and finally statistical data of the carbon content in the bottom section of the polycrystalline silicon column can be obtained. For example, more than 80% of the polycrystalline silicon column according to this embodiment in the bottom section has a carbon content greater than or equal to 4 ppma. That is, at least 80 of the 100 pieces of test specimens cut from the bottom section of the same polycrystalline silicon column have a carbon content greater than or equal to 4 ppma.

It can be seen from the above that, carbon is deliberately added during the crystal-growing process of the manufacturing method of the present disclosure, such that the formed polycrystalline silicon ingot may have a higher carbon content, especially in the bottom section, and thus the polycrystalline silicon brick or polycrystalline silicon wafer formed by cutting the polycrystalline silicon ingot with a higher carbon content has a lower defect area ratio and therefore a higher photoelectric conversion efficiency.

Figure 10:
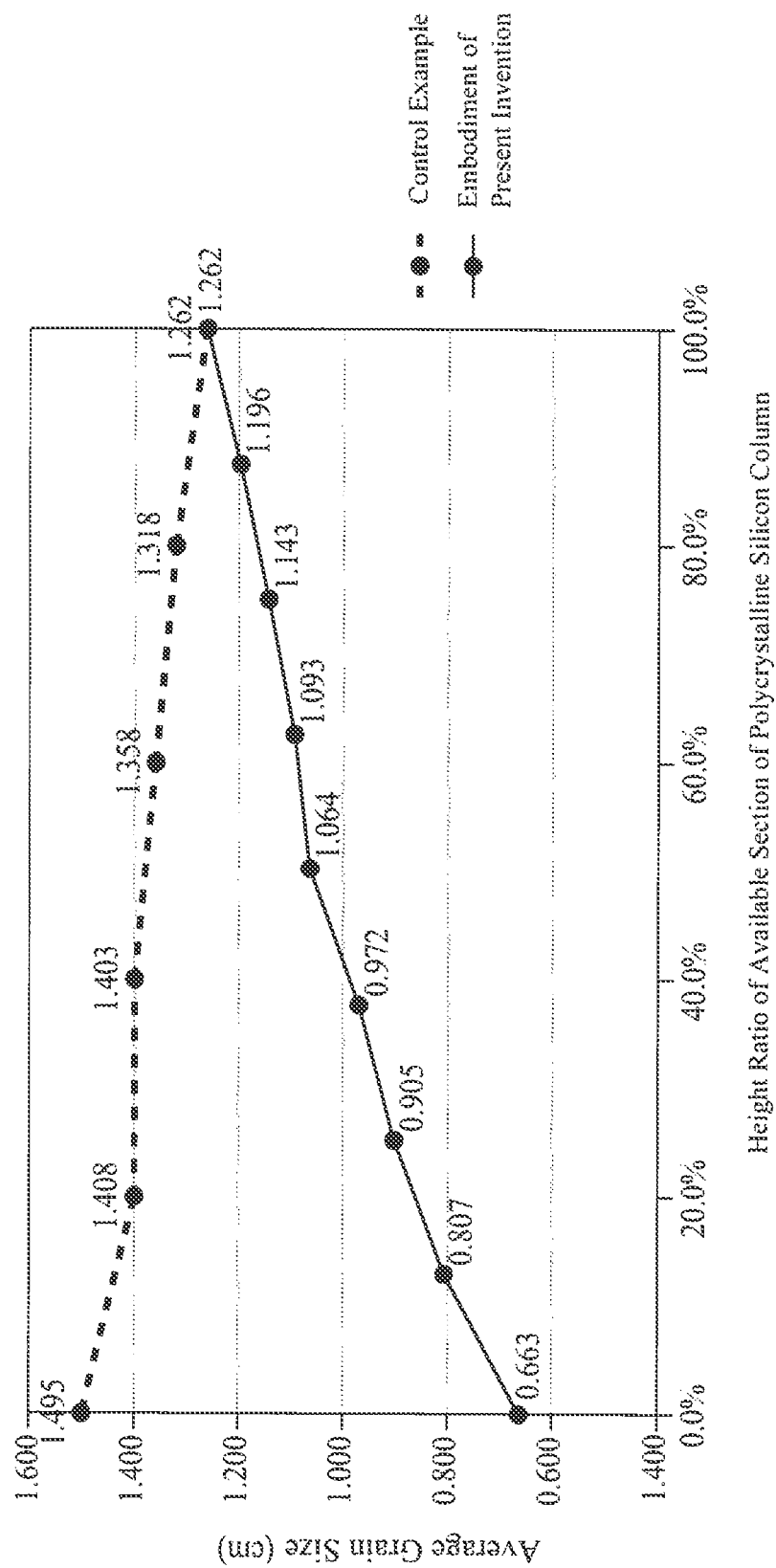
FIG. 10 is a relationship graph between the average grain sizes of the silicon grains of the polycrystalline silicon columns according to an embodiment of the disclosure and according to a control example and the available-section height ratios of the polycrystalline silicon columns.

A reference is made to FIG. 10. FIG. 10 is a relationship graph between the average grain sizes of the silicon grains of the polycrystalline silicon columns according to an embodiment of the disclosure and according to a control example and the available-section height ratios of the polycrystalline silicon columns, wherein the longitudinal axis is the average grain size, and the horizontal axis is the height ratio of the available section of the polycrystalline silicon column in the crystal-growing direction. As shown in FIG. 10, according to the measuring results of multiple groups of polycrystalline silicon column samples, for the grain size of the silicon grains in the polycrystalline silicon column (including the polycrystalline silicon ingot or the polycrystalline silicon brick) manufactured by the method of the disclosure, the average grain size in the available section of the polycrystalline silicon column is increased progressively along the crystal-growing direction (V). Furthermore, it can be seen from FIG. 10 that the average grain size of silicon grains at each position in the available section of the polycrystalline silicon column is less than or equal to 1.26 cm, the overall average grain size of the silicon grains in the available section of the polycrystalline silicon column is less than or equal to 1.1 cm, and specifically the average grain size of the silicon grains in the bottom section is less than or equal to 1.0 cm. On the other hand, the average grain size of the silicon grains in the polycrystalline silicon column according to the control example is decreased progressively along the crystal-growing direction (V). Furthermore, the overall average grain size of the silicon grains located in the available section of the polycrystalline silicon column according to the control example is greater than 1.26 cm, and specifically the average grain size in the bottom section is obviously greater than 1.4 cm.

The aforementioned average grain sizes of the embodiment of the disclosure and of the control example are measured according to the ASTM E112-10 standard measurement specification. For example, the polycrystalline silicon column sample is cut along the crystal-growing direction (V) into multiple test specimens, each piece of the test specimens are scanned to form an image thereof, then the number of silicon grains are observed along the diagonal line, and the average grain size is calculated according to the diagonal line length of the test specimen and the number of silicon grains.

Figure 11:
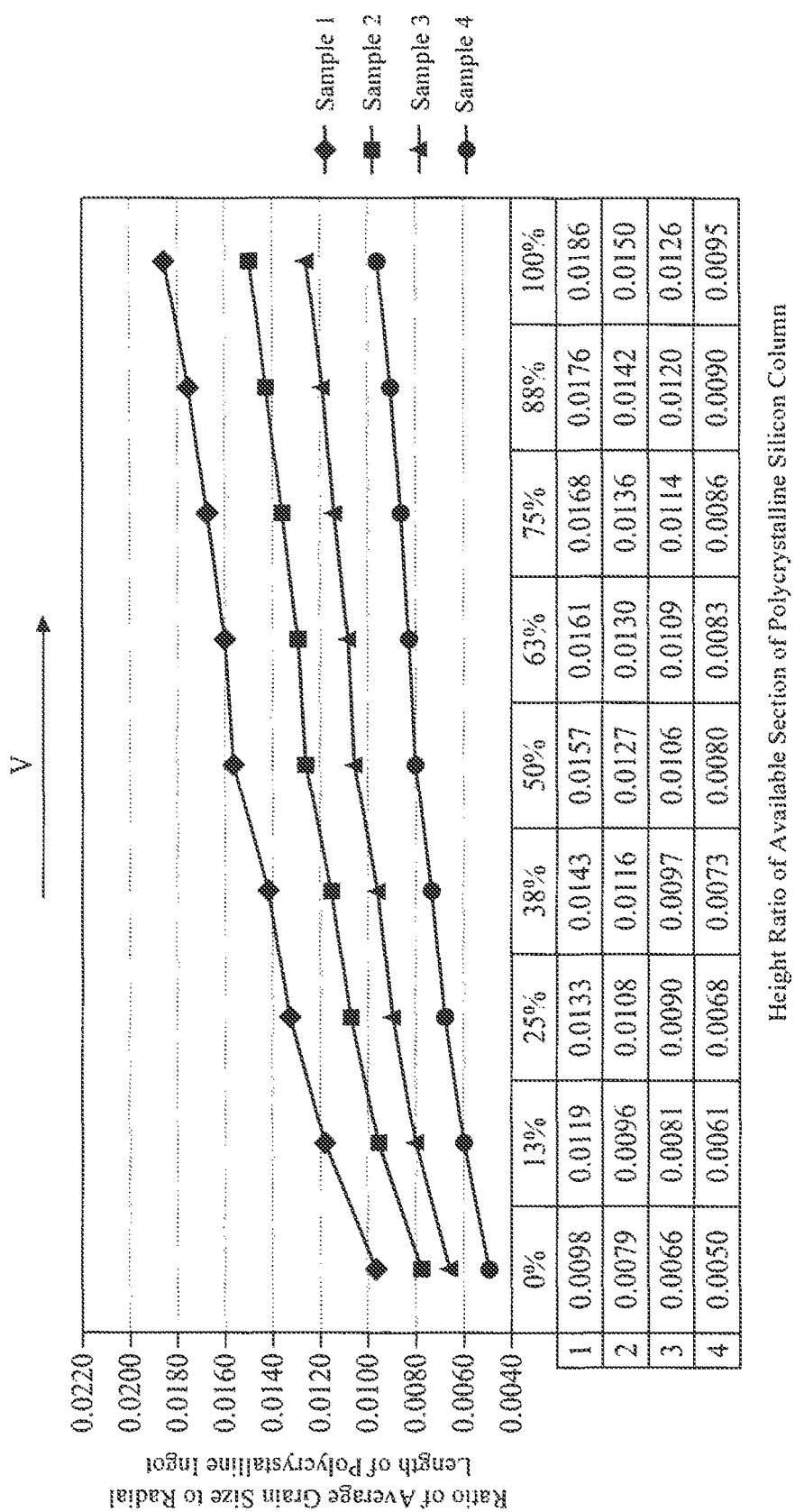
FIG. 11 is a distribution diagram of the polycrystalline silicon ingot according to an embodiment of the disclosure versus the ratio of an average grain size in the crystal-growing direction to the radial length of the crystalline ingot.

A reference is made to FIG. 11. FIG. 11 is a distribution diagram of the polycrystalline silicon ingot according to an embodiment of the disclosure versus the ratio of an average grain size in the crystal-growing direction to the radial length of the crystalline ingot, wherein the longitudinal axis is the ratio of the average grain size to the radial length of the cross section of the polycrystalline silicon ingot in a direction perpendicular to the crystal-growing direction, and the horizontal axis is the height ratio of the available section of the polycrystalline silicon ingot in the crystal-growing direction. Additionally, the radial length of the crystalline ingot of a sample 1 is between 675 mm and 690 mm, wherein a section with the ratio of the average grain size to the radial length of the crystalline ingot less than 0.0135 is defined as the bottom section; the radial length of the crystalline ingot of a sample 2 is between 820 mm and 855 mm, wherein a section with the ratio of the average grain size to the radial length of the crystalline ingot less than 0.0110 is defined as the bottom section; the radial length of the crystalline ingot of a sample 3 is between 975 mm and 1015 mm, wherein a section with the ratio of the average grain size to the radial length of the crystalline ingot less than 0.0093 is defined as the bottom section; and the radial length of the crystalline ingot of a sample 4 is between 1320 mm and 1330 mm, wherein a section with the ratio of the average grain size to the radial length of the crystalline ingot less than 0.0071 is defined as the bottom section. As shown in FIG. 11, the ratio of the average grain size in the bottom section of the polycrystalline silicon ingot to the radial length of the crystalline ingot is less than or equal to 0.01. In this embodiment, since the polycrystalline silicon ingot is formed by growing in a mold (e.g., a crucible), the ratio of the average grain size of the silicon grains in the bottom section of the polycrystalline silicon ingot to the size of the mold also comply with the aforementioned performance.

Figure 12:
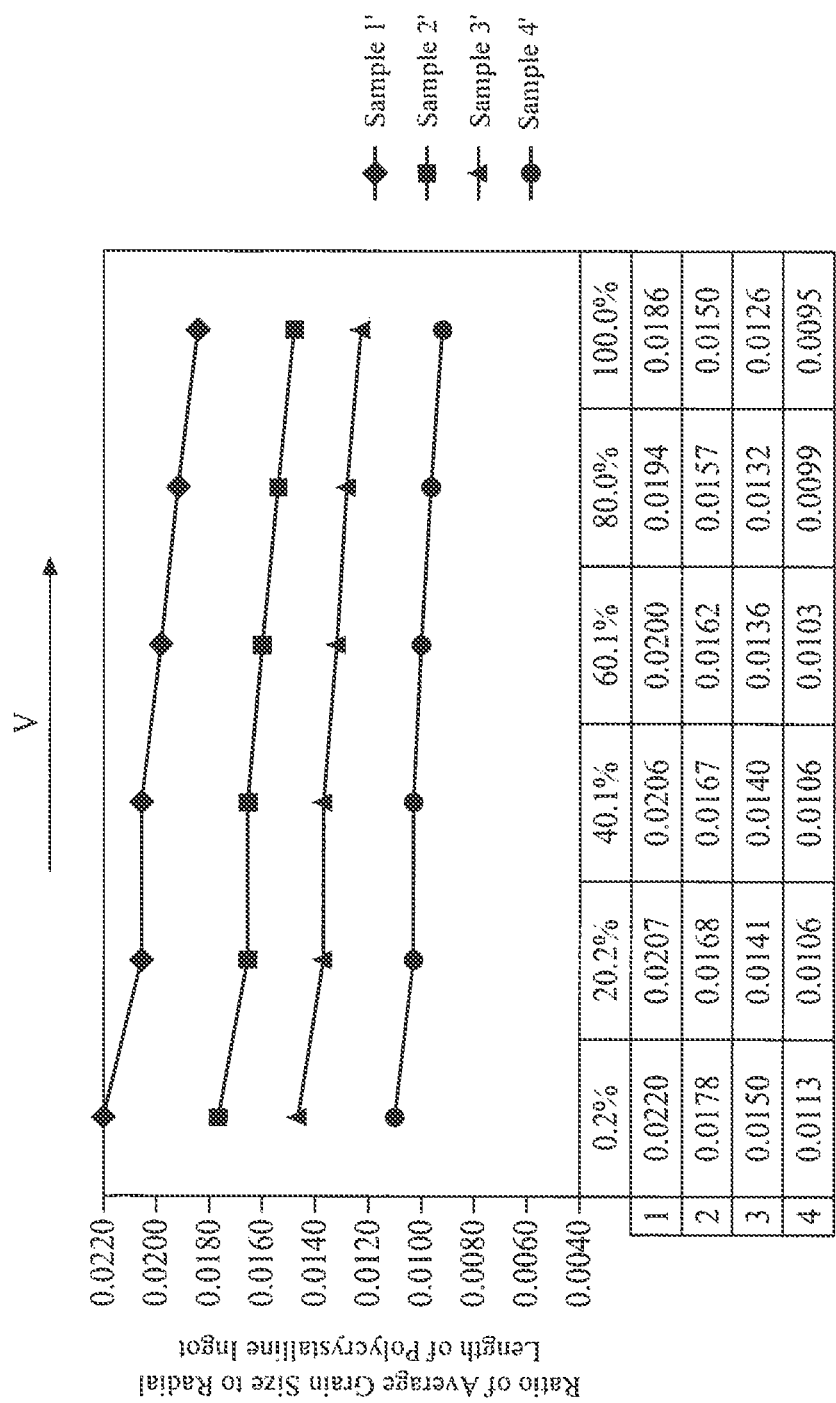
FIG. 12 is a distribution diagram of the polycrystalline silicon ingot according to a control example versus the ratio of an average grain size in the crystal-growing direction to the radial length of the crystalline ingot.

A reference is made to FIG. 12. FIG. 12 is a distribution diagram of the polycrystalline silicon ingot according to a control example versus the ratio of an average grain size in the crystal-growing direction to the radial length of the crystalline ingot, wherein the longitudinal axis is the ratio of the average grain size to the radial length of the cross section of the polycrystalline silicon ingot in a direction perpendicular to the crystal-growing direction, and the horizontal axis is the height ratio of the available section of the polycrystalline silicon ingot in the crystal-growing direction. Additionally, the radial length of the crystalline ingot of a sample 1' is between 675 mm and 690 mm; the radial length of the crystalline ingot of a sample 2' is between 820 mm and 855 mm; the radial length of the crystalline ingot of a sample 3' is between 975 mm and 1015 mm; and the radial length of the crystalline ingot of a sample 4' is between 1320 mm and 1330 mm. As shown in FIG. 12, in the control example, the ratio of the overall average grain size in the available section of the polycrystalline silicon ingot to the radial length of the crystalline ingot is greater than 0.01.

Figure 13:
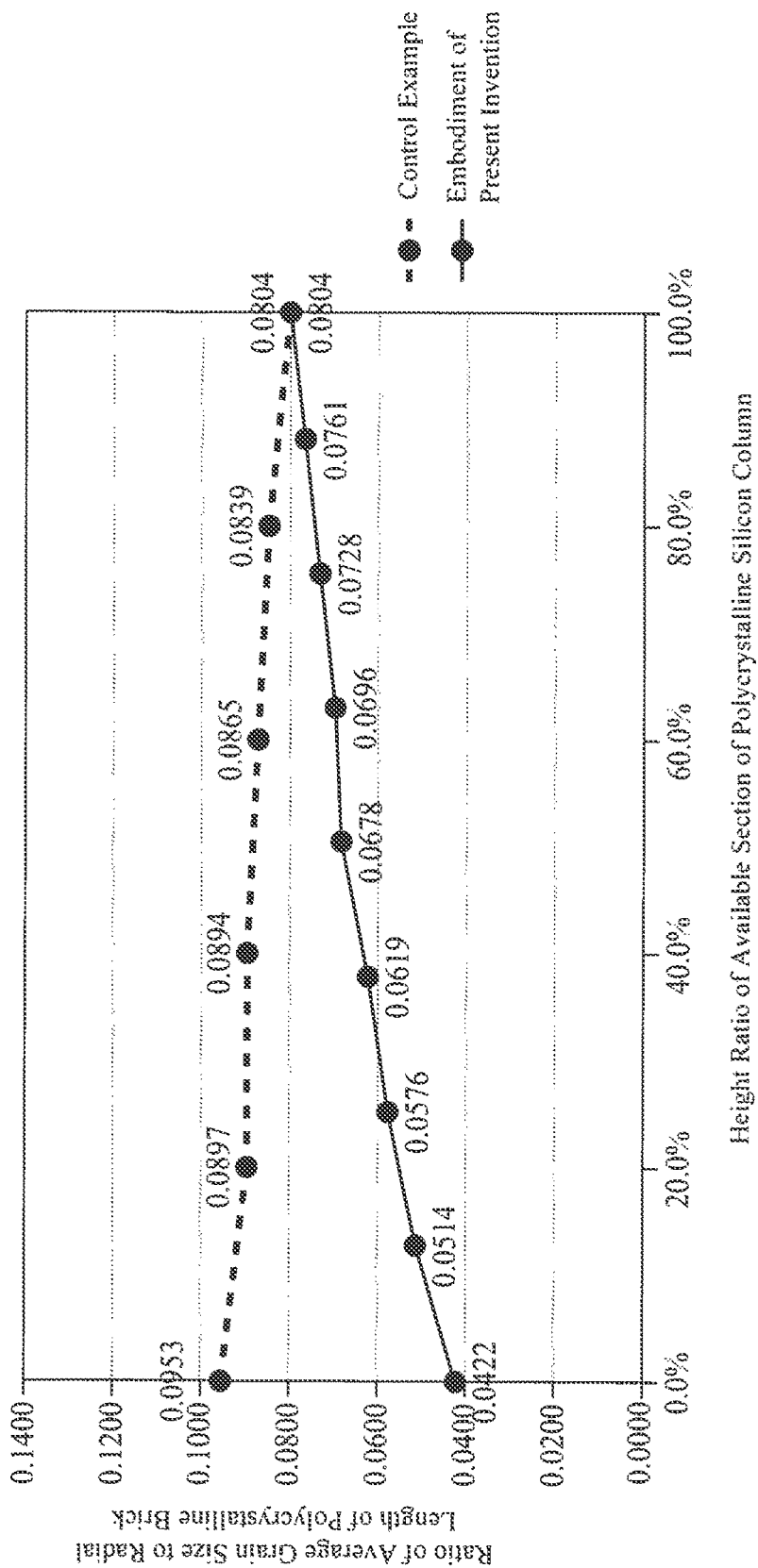
FIG. 13 is a distribution diagram of a polycrystalline brick according to an embodiment of the disclosure versus the ratio of the grain size in the crystal-growing direction to the radial length of the crystalline ingot.

A reference is made to FIG. 13. FIG. 13 is a distribution diagram of a polycrystalline silicon brick according to an embodiment of the disclosure versus the ratio of an average grain size in the crystal-growing direction to the radial length of the polycrystalline silicon brick, wherein the longitudinal axis is the ratio of the average grain size to the radial length of the cross section of the polycrystalline silicon brick in a direction perpendicular to the crystal-growing direction, and the horizontal axis is the height ratio of the available section of the polycrystalline silicon brick in the crystal-growing direction. As shown in FIG. 13, the average ratio of the overall average grain size in the available section of the polycrystalline silicon brick according to this embodiment to the radial length of the crystalline silicon brick is less than or equal to 0.08, and specifically the average ratio of the grain size in the bottom section to the radial length of the polycrystalline silicon brick is less than or equal to 0.061. The polycrystalline silicon brick of this embodiment may be cut along the crystal-growing direction (V) to form a polycrystalline silicon wafer, and the width of the polycrystalline silicon wafer is substantially equal to the radial length of the cross section of the polycrystalline silicon brick. In other words, in the polycrystalline silicon wafer formed by cutting the bottom section of the polycrystalline silicon brick of this embodiment, the ratio of the average grain size of the silicon grains to the radial length of the cross section of the polycrystalline silicon wafer also performed as before. On the other hand, in the control example, the average ratio of the overall average grain size in the available section of the polycrystalline silicon brick to the radial length of the polycrystalline silicon brick is greater than 0.08, which is greater than that of the embodiment.

Figure 14:
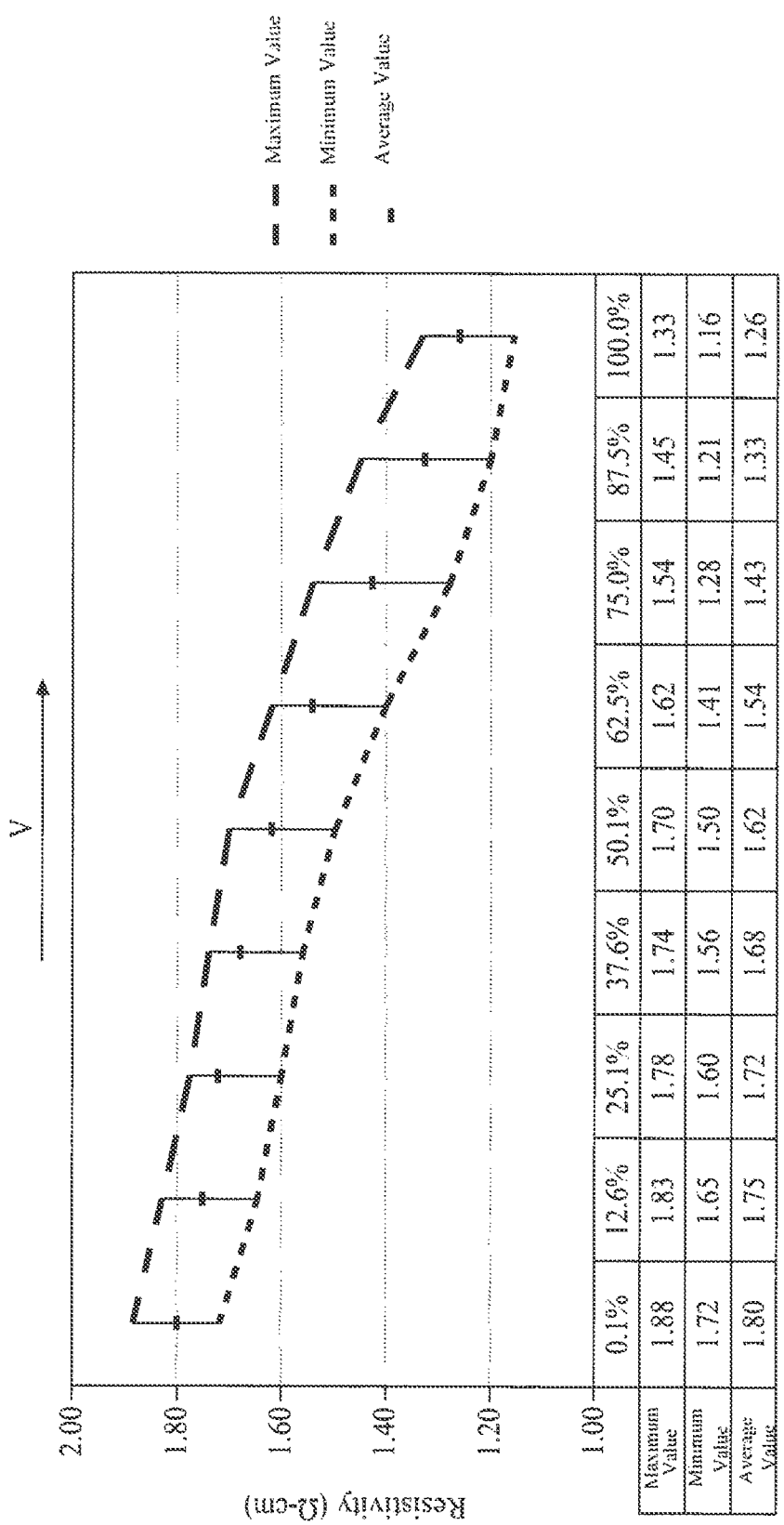
FIG. 14 is a relationship diagram between the resistivity of the polycrystalline silicon column according to an embodiment of the disclosure and the height ratio of the available section of the polycrystalline silicon column.

A reference is made to FIG. 14. FIG. 14 is a relationship diagram between the resistivity of a polycrystalline silicon column according to an embodiment of the disclosure and the height ratio of the available section of the polycrystalline silicon column, wherein the longitudinal axis is the resistivity of the polycrystalline silicon column, and the horizontal axis is the height ratio of the available section of the polycrystalline silicon column in the crystal-growing direction. As shown in FIG. 14, according to the measuring results of multiple groups of polycrystalline silicon column samples, for the resistivity of the polycrystalline silicon column (including the polycrystalline silicon ingot or the polycrystalline silicon brick) manufactured by the method of the disclosure, the resistivity of a sample having either a largest resistivity value or a smallest resistivity value is decreased progressively along the crystal-growing direction (V), and thus the average resistivity value calculated from the multiple groups of samples is also decreased progressively along the crystal-growing direction (V). In other words, with reference to FIGS. 10 and 14, it can be observed that in the crystal-growing direction (V) the average grain size of the silicon grains in the polycrystalline silicon column manufactured by the method of the disclosure and the resistivity of the polycrystalline silicon column have the opposite variation in their trends. Furthermore, it can be seen from FIG. 14 that the resistivity in the bottom section of the polycrystalline silicon column is greater than or equal to 1.55 $\Omega$-cm, for example between 1.55 $\Omega$-cm and 1.9 $\Omega$-cm, and thus the resistivity of the polycrystalline silicon wafer formed by cutting the bottom section of the polycrystalline silicon column of this embodiment is also greater than or equal to 1.55 $\Omega$-cm.

In this embodiment, the measurement of resistivity is performed using the following method. A side face of the polycrystalline silicon column is tested using a non-contact resistivity meter, and the average value of values measured at four sides of the polycrystalline silicon column at each height is considered as the resistivity of this height; or the wafer cut from the polycrystalline silicon column is detected using the non-contact resistivity meter, such that the resistivity of each wafer is obtained, and the resistivity variation at respective heights can be known by arranging the wafers along the crystal-growing direction. The non-contact resistivity measuring method is performed as follows. An AC current with a fixed frequency is introduced onto a transmitting coil, and then when the magnetic field generated by the coil approaches the object to be measured, an eddy current occurs in the object to be measured. The strength of the eddy current is inversely proportional to the resistivity, and thus the resistivity of the object to be measured can be obtained.

Figure 15:
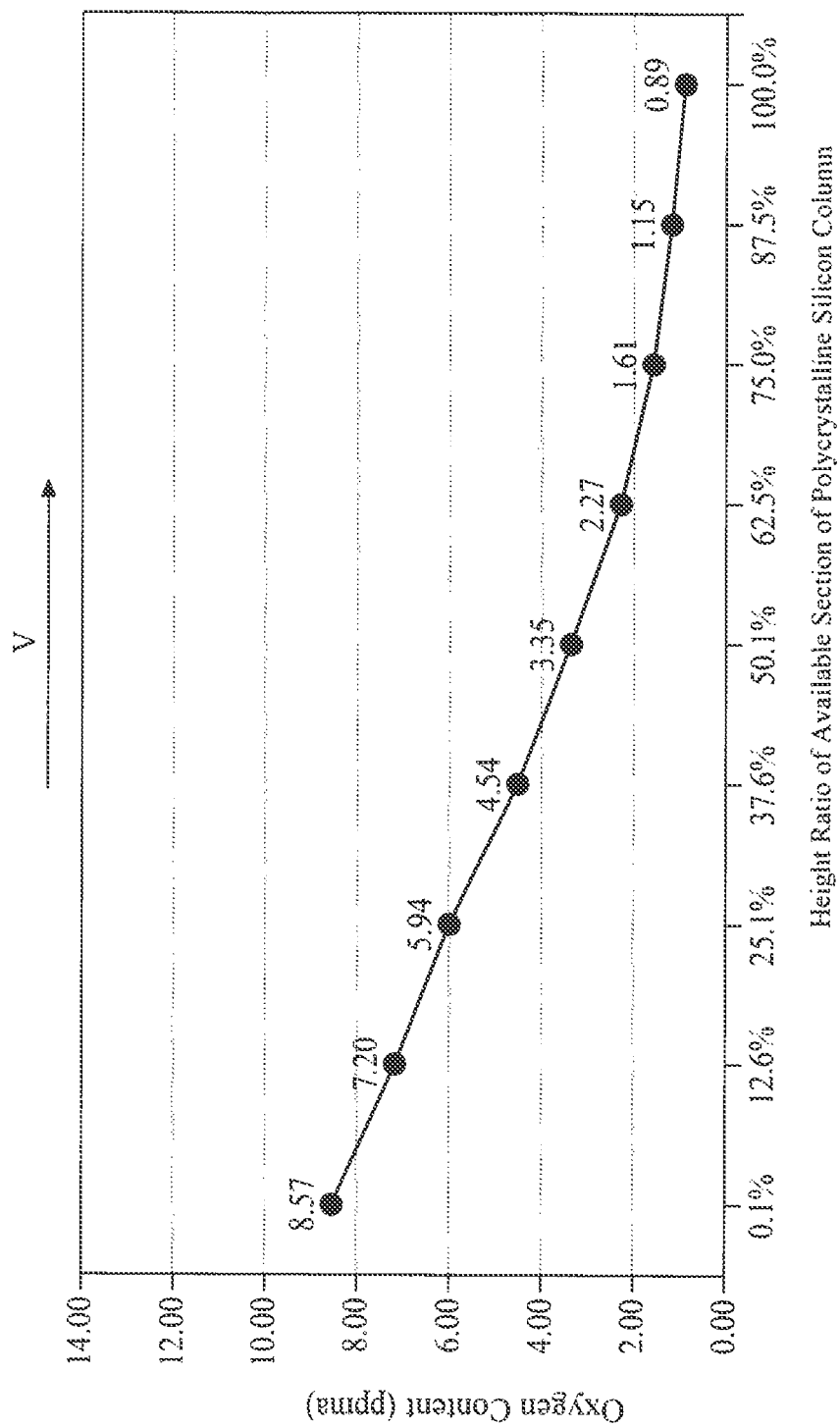
FIG. 15 is a relationship diagram between the oxygen content of the polycrystalline silicon column according to an embodiment of the disclosure and the height ratio of the available section of the polycrystalline silicon column.

A reference is made to FIG. 15. FIG. 15 is a relationship graph between the oxygen content of a polycrystalline silicon column according to an embodiment of the disclosure and the height ratio of the available section of the polycrystalline silicon column, wherein the longitudinal axis is the oxygen content, and the horizontal axis is the height ratio of the available section of the polycrystalline silicon column in the crystal-growing direction. The measuring and sampling manners of the oxygen content of the polycrystalline silicon column according to the embodiment are similar to that of the carbon content of the polycrystalline silicon column according to the aforementioned embodiment. That is, the polycrystalline silicon column is cut into a plurality of test specimens, the oxygen contents at different positions on the test specimen are measured by using the FTIR measuring instrument with reference to the ASTM MF1188-1105 standard measurement specification, and then an average value of the oxygen contents is taken as the oxygen content of the test specimen. The oxygen contents of all test specimens represent the oxygen contents of the polycrystalline silicon column at different positions in the crystal-growing direction. As shown in FIG. 15, according to the measuring results of multiple groups of polycrystalline silicon column samples, the oxygen contents of the polycrystalline silicon columns (including the polycrystalline silicon ingot or the polycrystalline silicon brick) manufactured by the method of the disclosure are all decreased progressively along the crystal-growing direction (V). In other words, with reference to FIGS. 10 and 15, it can be observed that in the crystal-growing direction (V) the average grain size of the silicon grains in the polycrystalline silicon column manufactured by the method of the disclosure and the oxygen content of the polycrystalline silicon column have the opposite variation in their trends. Furthermore, it can be seen from FIG. 15 that, the oxygen content in the bottom section of the available section of the polycrystalline silicon column is greater than or equal to 5.5 ppma.

Figure 16:
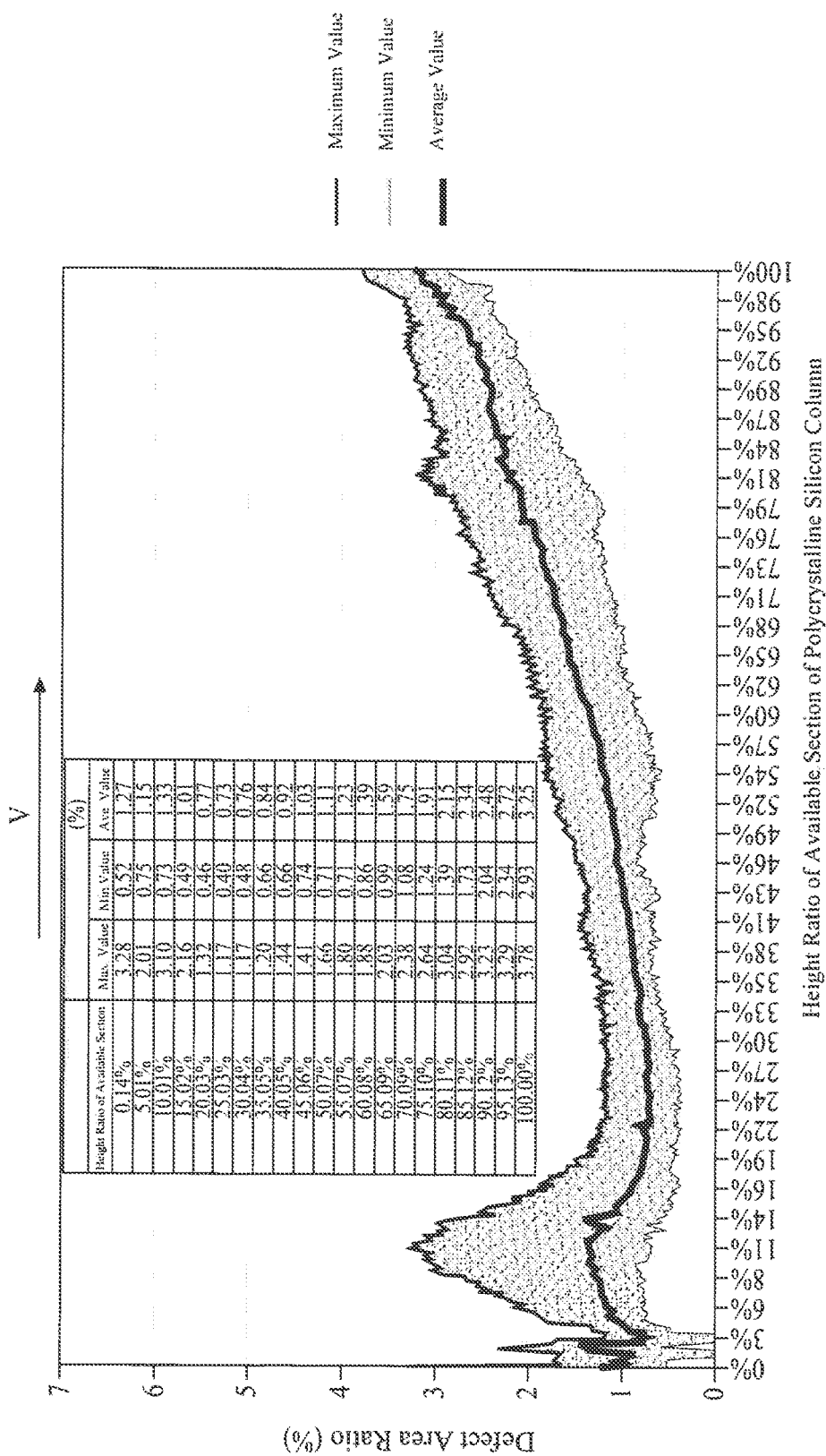
FIG. 16 is a relationship diagram between the defect area ratio of the polycrystalline silicon column according to an embodiment of the disclosure and the height ratio of the available section of the polycrystalline silicon column.

A reference is made to FIG. 16. FIG. 16 is a relationship graph between the defect area ratio of the polycrystalline silicon column according to an embodiment of the disclosure and the height ratio of the available section of the polycrystalline silicon column, wherein the longitudinal axis is the defect area ratio, and the horizontal axis is the height ratio of the available section of the polycrystalline silicon column. In this embodiment, the detection manner of the defect area ratio is performed by detecting with a photoluminescence (PL) meter, wherein a light with energy higher than the semiconductor energy gap is irradiated onto the polycrystalline silicon to generate a fluorescent light emitted due to carrier transition and complex behaviors, then a defect position is determined by a measuring system according to a fluorescence spectra, and the defect area ratio is thus calculated. First, with reference to FIGS. 10 and 16, it can be seen that in the crystal-growing direction (V), the average grain size of the silicon grains in the polycrystalline silicon column manufactured by the method of the disclosure and the defect area ratio of the polycrystalline silicon column have the same variation in their trends. Furthermore, as shown in FIG. 16, the defect area ratios at respective positions in the available section of the polycrystalline silicon column (including the polycrystalline silicon ingot or the polycrystalline silicon brick) manufactured by the method of the disclosure are all less than 3.5%, and the overall average defect area ratio in the available section of the polycrystalline silicon column is less than or equal to 2.5%, and specifically the average defect area ratio in the bottom section is less than or equal to 1.5%. Therefore, a wafer formed by cutting a polycrystalline silicon column formed according to the present disclosure has a higher photoelectric conversion efficiency. As compared, the overall average defect area ratio in the available section of the polycrystalline silicon column manufactured by the whole melting process of the control example is greater than 4%, and thus a wafer cut from the polycrystalline silicon column has a lower photoelectric conversion efficiency.

In the manufacturing method of the disclosure, during the crystal-growing process, the silicon melt is exposed to a carbon-containing environment, and thus the formed polycrystalline silicon column has a higher carbon content, and especially the bottom section has a higher carbon content. As such, the polycrystalline silicon wafer formed by cutting the polycrystalline silicon column with a higher carbon content also has a higher carbon content and a lower defect area ratio, and accordingly a higher photoelectric conversion efficiency. Furthermore, in addition to having a higher carbon content, the polycrystalline silicon column or polycrystalline silicon wafer manufactured by the method of the disclosure also has the characteristics of an average grain size of the silicon grains that increase progressively along the crystal-growing direction, a smaller average defect area ratio, a smaller average grain size of the silicon grains, and the like.

In the prior art, those of ordinary skills believe that if the polycrystalline silicon ingot has a lower carbon content, then the quality of the polycrystalline silicon ingot is better; and in contrast, if the carbon content is too high, a problem of silicon carbide precipitates occurs, which causes a decreased yield of the polycrystalline silicon wafer made from the polycrystalline silicon ingot, an even a increase of current leakage, thereby reducing the photoelectric conversion efficiency. The present disclosure steps out from the narrow view of the prior art, which adds carbon into the crystal-growing process deliberately so as to manufacture a polycrystalline silicon ingot with a higher carbon content. Specifically the polycrystalline silicon ingot has a higher carbon content in the bottom section, and thus the polycrystalline silicon brick or polycrystalline silicon wafer formed by cutting the polycrystalline silicon ingot with a higher carbon content also has the characteristics of a higher carbon content and a lower defect area ratio, and accordingly a higher photoelectric conversion efficiency.

The features of some implementations are described in brief, and thus those skilled in the art can understand aspects of the disclosure better. It should be understood by those skilled in the art that, the disclosure of the application can be readily used as a basis to design or modify other processes and structures, thereby achieving the same purposes and/or same advantages as the implementation of the application. It should be understood by those skilled in the art that, such an equivalent architecture does not depart from the spirit and scope of the disclosure of the application, and various changes, substitutions and replacements can be made by those skilled in the art without departing from the spirit and scope of the disclosure of the application.

What is claimed:

1. A polycrystalline silicon column having a crystal-growing direction, wherein the polycrystalline silicon column comprises:
a plurality of silicon grains growing along a crystal-growing direction, wherein in the crystal-growing direction, the average grain size of the silicon grains and the resistivity of the polycrystalline silicon column have opposite variation in their trends, and wherein an average defect area ratio of a bottom section of the polycrystalline silicon column is less than or equal to 1.5%.

2. The polycrystalline silicon column of claim 1, wherein the average grain size of the silicon grains is increased progressively along the crystal growing direction, and the resistivity of the polycrystalline silicon column is decreased progressively along the crystal-growing direction.

3. The polycrystalline silicon column of claim 1, further comprising an available section, wherein the minority carrier lifetime of the available section is greater than or equal to $2.0 \times 10^{-6}$ seconds, and the available section comprises the bottom section.

4. The polycrystalline silicon column of claim 3, wherein the silicon grains comprise at least three crystal orientations, the at least three crystal orientations comprising $\{112\}$, $\{113\}$ and $\{115\}$; and wherein in the bottom section, the volume percent of the silicon grains having the crystal orientations $\{112\}$, $\{113\}$ and $\{115\}$ is greater than 45%.

5. The polycrystalline silicon column of claim 3, wherein in the bottom section, the volume percent of the silicon grains having the crystal orientation {112} is between 25% and 30%.

6. The polycrystalline silicon column of claim 3, wherein in the bottom section, the volume percent of the silicon grains having the crystal orientation {112} is greater than the volume percent of the silicon grains having the crystal orientation {113} or {115}.

7. The polycrystalline silicon column of claim 3, wherein the polycrystalline silicon column is a crystalline ingot having a cross section perpendicular to the crystal-growing direction, the cross section has a radial length, and the ratio of the average grain size of the silicon grains in the bottom section to the radial length of the cross section of the crystalline ingot is less than or equal to 0.01.

8. The polycrystalline silicon column of claim 3, wherein the polycrystalline silicon column is a crystal brick having a cross section perpendicular to the crystal-growing direction, the cross section has a radial length, and the ratio of the average grain size of the silicon grains in the bottom section to the radial length of the cross section of the crystal brick is less than or equal to 0.061.

9. The polycrystalline silicon column of claim 3, wherein the average grain size of the silicon grains in the bottom section is less than or equal to 1.0 cm.

10. The polycrystalline silicon column of claim 3, wherein the oxygen content of the polycrystalline silicon column in the bottom section is greater than or equal to 5.5 ppma.

11. The polycrystalline silicon column of claim 3, wherein the resistivity of the polycrystalline silicon column in the bottom section is greater than or equal to 1.55 Ω-cm.

12. The polycrystalline silicon column of claim 3, wherein more than 80% of the polycrystalline silicon column in the bottom section has a carbon content greater than or equal to 4 ppma.

13. The polycrystalline silicon column of claim 3, wherein more than 60% of the polycrystalline silicon column in the bottom section has a carbon content greater than or equal to 5 ppma.

14. The polycrystalline silicon column of claim 3, wherein more than 25% of the polycrystalline silicon column in the bottom section has a carbon content greater than or equal to 6 ppma.

* * * * *